US012750962B2

(12) United States Patent
Shim

(10) Patent No.: US 12,750,962 B2
(45) Date of Patent: Sep. 29, 2026

(54) ELECTRONIC DEVICE COMPRISING GUIDE MEMBER FOR WIRING

(71) Applicant: Samsung Electronics Co., Ltd., Suwon-si (KR)

(72) Inventor: Heebo Shim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 30 days.

(21) Appl. No.: 18/805,792

(22) Filed: Aug. 15, 2024

(65) Prior Publication Data

US 2024/0414864 A1 Dec. 12, 2024

Related U.S. Application Data

(63) Continuation of application No. PCT/KR2023/001740, filed on Feb. 7, 2023.

(30) Foreign Application Priority Data

Apr. 15, 2022 (KR) ........................ 10-2022-0046778
May 13, 2022 (KR) ........................ 10-2022-0058779

(51) Int. Cl.
*H05K 5/02* (2006.01)
*H05K 5/06* (2006.01)

(52) U.S. Cl.
CPC ......... *H05K 5/0247* (2013.01); *H05K 5/0226* (2013.01); *H05K 5/06* (2013.01)

(58) Field of Classification Search
CPC .... G06F 1/1616; G06F 1/1652; G06F 1/1656; G06F 1/1681; G06F 1/1683; H05K 5/0226; H05K 5/0247; H05K 5/06
See application file for complete search history.

(56) References Cited

U.S. PATENT DOCUMENTS 10,736,211 B2 * 8/2020 Park ....................... G06F 1/1683
11,178,779 B2 * 11/2021 Sim ....................... G06F 1/1681
(Continued)

FOREIGN PATENT DOCUMENTS

CN 207638710 U 7/2018
CN 110167304 A 8/2019
(Continued)

OTHER PUBLICATIONS

Extended European Search Report Issued In EP Application No. 25183481.8-1218; Mail Date Sep. 17, 2025; 8 Pages.
International Search Report with Written Opinion issued in International Application No. PCT/KR2023/001740; International Filing Date Feb. 7, 2023; Date of Mailing May 11, 2023 (9 pages).
Extended European Search Report Issued In EP Application No. 23788448.1-1218; Mail Date Mar. 6, 2025; 07 Pages.
(Continued)

*Primary Examiner* — Kenneth Bukowski
(74) *Attorney, Agent, or Firm* — CANTOR COLBURN LLP

(57) ABSTRACT

An electronic device includes first and second housings, first and second display areas disposed on the first and second housings, respectively, and a folding area disposed between the first and second display areas and at least one flexible printed circuit board including at least one fixed plate disposed on one surface thereof. The at least one flexible printed circuit board extends from the first housing to the second housing. At least one of the first and second housings includes a support plate supporting at least a portion of either of the first and second display areas, and in which at least one through hole is formed. A guide member is disposed in the through hole with a wiring hole. At least a portion of the flexible printed circuit board may pass through the wiring hole. The fixed plate may be disposed on an inner wall of the wiring hole.

20 Claims, 20 Drawing Sheets

(56) References Cited

U.S. PATENT DOCUMENTS

| | | | | |
|---|---|---|---|---|
| 2014/0239277 | A1 | 8/2014 | Kim et al. | |
| 2015/0131024 | A1 | 5/2015 | Sakamoto | |
| 2019/0041917 | A1 | 2/2019 | Chung | |
| 2019/0068770 | A1 | 2/2019 | Seo et al. | |
| 2020/0060020 | A1* | 2/2020 | Park | H05K 1/028 |
| 2020/0120193 | A1 | 4/2020 | Ha et al. | |
| 2020/0162596 | A1* | 5/2020 | Kim | G06F 1/1656 |
| 2020/0265212 | A1 | 8/2020 | Jung et al. | |
| 2020/0333849 | A1 | 10/2020 | Cho et al. | |
| 2020/0351393 | A1* | 11/2020 | Kang | H04M 1/022 |
| 2021/0127469 | A1 | 4/2021 | Lee et al. | |
| 2021/0376048 | A1 | 12/2021 | Kim et al. | |
| 2022/0035410 | A1* | 2/2022 | Lee | G06F 1/1652 |
| 2022/0061175 | A1 | 2/2022 | Oh et al. | |
| 2022/0118734 | A1 | 4/2022 | Kang et al. | |
| 2022/0129046 | A1* | 4/2022 | Baek | G06F 1/1652 |
| 2022/0255576 | A1* | 8/2022 | Cho | H04B 1/3888 |
| 2023/0354524 | A1* | 11/2023 | Kim | H05K 1/0281 |

FOREIGN PATENT DOCUMENTS

| | | | |
|---|---|---|---|
| CN | 214960624 | U | 11/2021 |
| CN | 116264757 | A | 6/2023 |
| JP | 2012095150 | A | 5/2012 |
| KR | 20150053378 | A | 5/2015 |
| KR | 20200057236 | A | 5/2020 |
| KR | 20230022775 | A | 2/2023 |
| KR | 20230023268 | A | 2/2023 |

OTHER PUBLICATIONS

European Office Action for European Application No. 23 788 448.1-1218; Report Mail Date Jun. 11, 2026 (7 Pages).

European Office Action for European Application No. 25 183 481.8-1218; Report Mail Date Jun. 11, 2026 (9 Pages).

* cited by examiner

ELECTRONIC DEVICE COMPRISING GUIDE MEMBER FOR WIRING

CROSS-REFERENCE TO RELATED APPLICATION(S)

This application is a continuation application, claiming priority under § 365 (c), of International Application No. PCT/KR2023/001740, filed on Feb. 7, 2023, which is based on and claims the benefit of Korean patent application number 10-2022-0046778, filed on Apr. 15, 2022, and Korean patent application number 10-2022-0058779, filed on May 13, 2022, in the Korean Intellectual Property Office, the disclosures of which are incorporated by reference herein in their entireties.

TECHNICAL FIELD

An embodiment of the disclosure relates to an electronic device, and to an electronic device including a guide member for wiring.

BACKGROUND ART

An electronic device may refer to a device that executes a specific function according to a loaded program, such as a home appliance, an electronic notebook, a portable multimedia player, a mobile communication terminal, a tablet PC, a video/audio device, a desktop/laptop computer, or a vehicle navigation device. For example, these electronic devices may output stored information as sound or an image. As the integration level of electronic devices increases and high-speed, large-capacity wireless communication becomes more common, a single electronic device such as a mobile communication terminal may recently be equipped with various functions. For example, in addition to a communication function, an entertainment function such as games, a multimedia function such as music/video playback, a communication and security function for mobile banking, and a function such as schedule management or an electronic wallet are integrated in a single electronic device.

As the use of personal or portable communication devices such as smartphones becomes more common, user demands for portability and ease of use are increasing. For example, a touch screen display may provide a screen, for example, a virtual keypad which is an output device outputting visual information and substitutes for a mechanical input device (e.g., a button-type input device). Therefore, a portable communication device or an electronic device may be miniaturized while providing the same or improved usability (e.g., a larger screen). On the other hand, the portability and ease of use of electronic devices is expected to be further enhanced along with the commercialization of flexible displays, for example, foldable or rollable displays. An electronic device including a flexible display may be carried with a plurality of different structures (e.g., housings) folded or rolled, and provide a large screen when unfolded, thereby improving portability and ease of use.

The above information is presented as background information only to assist with an understanding of the disclosure. No determination has been made, and no assertion is made, as to whether any of the above might be applicable as prior art with regard to the disclosure.

DETAILED DESCRIPTION OF THE INVENTION

Technical Problem

In a structure where a plurality of different structures move relative to each other, for example, in an electronic device deformable between a folded (or rolled) state and an unfolded state, a flexible printed circuit board may be useful in providing electrical connections while allowing relative movements or displacements of structures or internal electronic components. For example, the flexible printed circuit board may be used as a wiring to electrically connect electrical/electronic components within different structures. The flexible printed circuit board may be damaged due to an increased fatigue degree or mechanical interference caused by repeated deformation motions of the electronic device. Therefore, an electrical wiring (e.g., a flexible printed circuit board) may be wired in a location or path that does not interfere with other mechanical structures, and partially restrained or fixed to deform within a specified shape range during a deformation motion of the electronic device. However, due to the limited internal space of a small/lightweight electronic device, it may be difficult to secure a wiring location and path for the flexible printed circuit board, or to secure a structure that partially restrains or fixes the flexible printed circuit board. When an arrangement structure for the flexible printed circuit board is secured in a small internal space, an arrangement space for other electrical/electronic components or a battery capacity may be limited.

An embodiment of the disclosure may provide an electronic device including a stable arrangement structure for an electrical wiring disposed between a plurality of different structures.

An embodiment of the disclosure may provide an electronic device that may efficiently use an internal space while providing a stable electrical wiring.

An embodiment of the disclosure may provide an electronic device with improved waterproof performance while providing a stable electrical wiring.

Additional aspects according to various embodiments will be presented in the following detailed description, and may be apparent, in part, from the description or understood from an embodiment of the presented implementation.

Technical Solution

According to an embodiment of the disclosure, an electronic device includes a housing including a first housing and a second housing configured to pivot with respect to the first housing around a folding axis, a display including a first display area disposed on the first housing, a second display area disposed on the second housing, and a folding area disposed between the first display area and the second display area, a hinge module disposed inside the housing, providing the folding axis, and pivotably connecting the first housing and the second housing to each other, and at least one flexible printed circuit board including at least one fixing plate disposed on one surface thereof, and extending from the first housing to the second housing across the hinge module. In an embodiment, at least one of the first housing or the second housing includes a support plate supporting at least a portion of one of the first display area and the second display area, and forming at least one through hole penetrating both surfaces thereof, and a guide member disposed in the through hole and forming a wiring hole. In an embodiment, at least a portion of the flexible printed circuit board is disposed to pass through the wiring hole, and the fixing plate is disposed on an inner wall of the wiring hole.

According to an embodiment of the disclosure, an electronic device includes a housing including a first housing and a second housing configured to pivot with respect to the first housing around a folding axis, a display including a first display area disposed on the first housing, a second display area disposed on the second housing, and a folding area disposed between the first display area and the second display area, a hinge module disposed inside the housing, providing the folding axis, and pivotably connecting the first housing and the second housing to each other, and at least one flexible printed circuit board extending from the first housing to the second housing across the hinge module. In an embodiment, at least one of the first housing or the second housing includes a support plate supporting at least a portion of one of the first display area and the second display area, and forming at least one through hole penetrating both surfaces thereof, a guide member disposed in the through hole and forming a wiring hole, and a waterproof member disposed in the wiring hole and configured to form a waterproof structure within the wiring hole. In an embodiment, a portion of the flexible printed circuit board is bonded to the waterproof member between the display and the waterproof member, and another portion of the flexible printed circuit board is fixed between an inner wall of the wiring hole and the waterproof member.

Advantageous Effects

According to an embodiment of the disclosure, a flexible printed circuit board may be protected from interference with other electrical/electronic components or mechanical structures, at least inside housing(s).

According to an embodiment of the disclosure, the flexible printed circuit board may be stably fixed within a wiring hole by including a fixing plate.

In an embodiment, the wiring hole is disposed adjacent to edge(s) of the housing(s) in wiring the flexible printed circuit board, thereby increasing the degree of design freedom in arranging electrical/electronic components inside the housing(s) and facilitating a battery capacity to be secured.

In an embodiment, a waterproof member may be disposed in the wiring hole to bring the flexible printed circuit board and/or the fixing plate into close contact with an inner wall of the wiring hole, and improve the waterproof performance of the electronic device by sealing the wiring hole. Various other effects directly or indirectly identifiable through this specification may be provided.

BRIEF DESCRIPTION OF DRAWINGS

The above-described or other aspects, configurations, and/or advantages of an embodiment of the disclosure will become more apparent from the following detailed description with reference to the accompanying drawings.

Like reference numerals denote like parts, components, and/or structures throughout the accompanying drawings.

MODE FOR CARRYING OUT THE INVENTION

Figure 1:
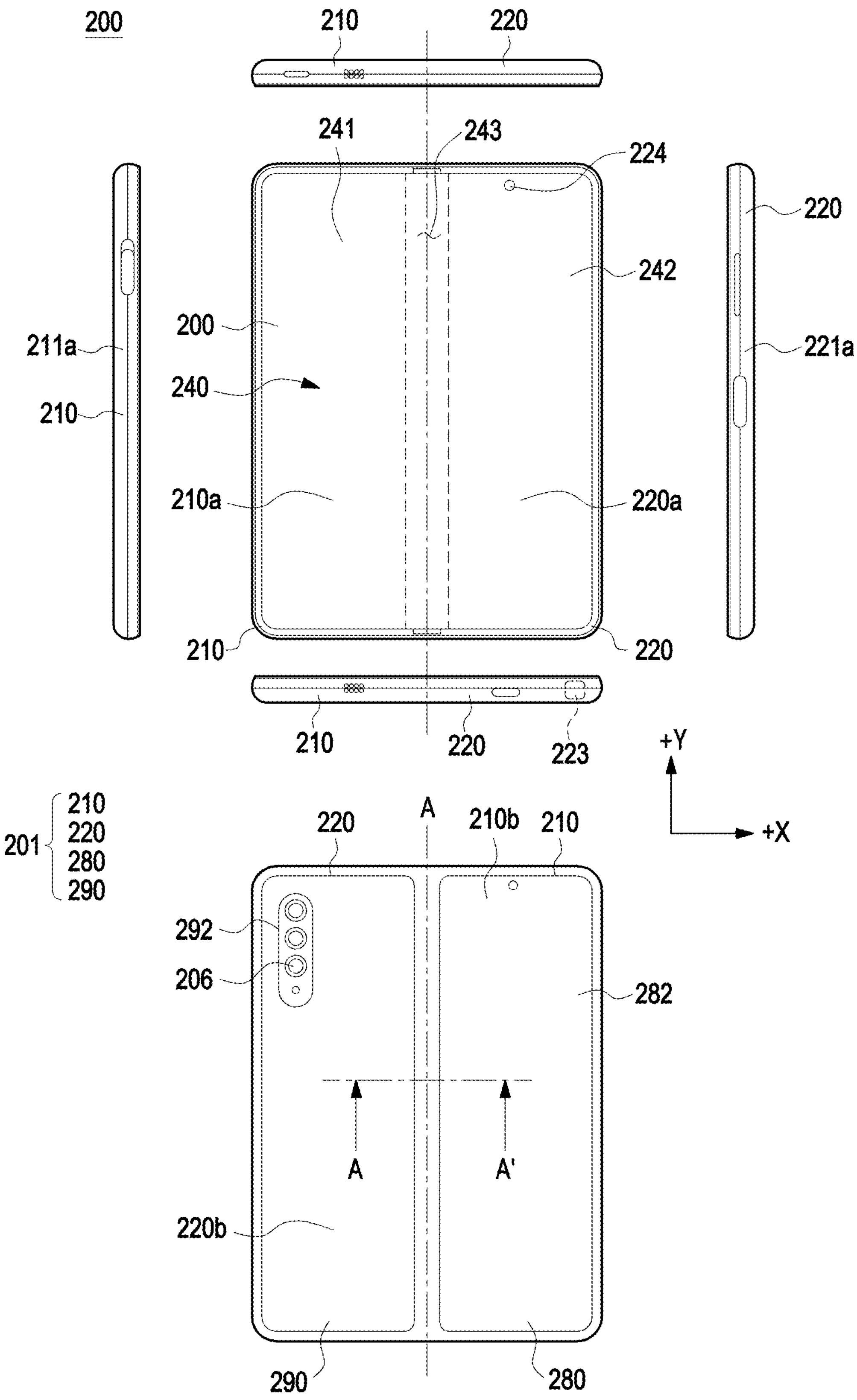
FIG. 1 is a diagram illustrating an electronic device in an unfolded state according to an embodiment of the disclosure.

The following description taken in conjunction with the accompanying drawings may provide an understanding of various exemplary implementations of the disclosure, including the claims and corresponding content. Although an exemplary embodiment disclosed in the following description includes numerous specific details to aid understanding, this is considered to be one of many example embodiments. Therefore, it is obvious to those skilled in the art that various changes and modifications may be made to various implementations described in this document without departing from the scope and spirit of the disclosure. Further, a description of well-known functions and configurations will be avoided for clarity and conciseness.

The terms and words used in the following description and claims are not limited to referential meanings and may be used to clearly and consistently describe various embodiments of the disclosure. Therefore, it is obvious to those skilled in the art that the following description of various implementations of the disclosure is provided for illustrative purposes and not for the purpose of limiting the scope of the disclosure and its equivalents.

Unless the context clearly dictates otherwise, the singular forms "a", "an", and "the" should be understood to include plural meanings. Accordingly, for example, "a surface of a component" may be understood to include one or more of the surfaces of the component.

An electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "$1^{st}$" and "$2^{nd}$", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
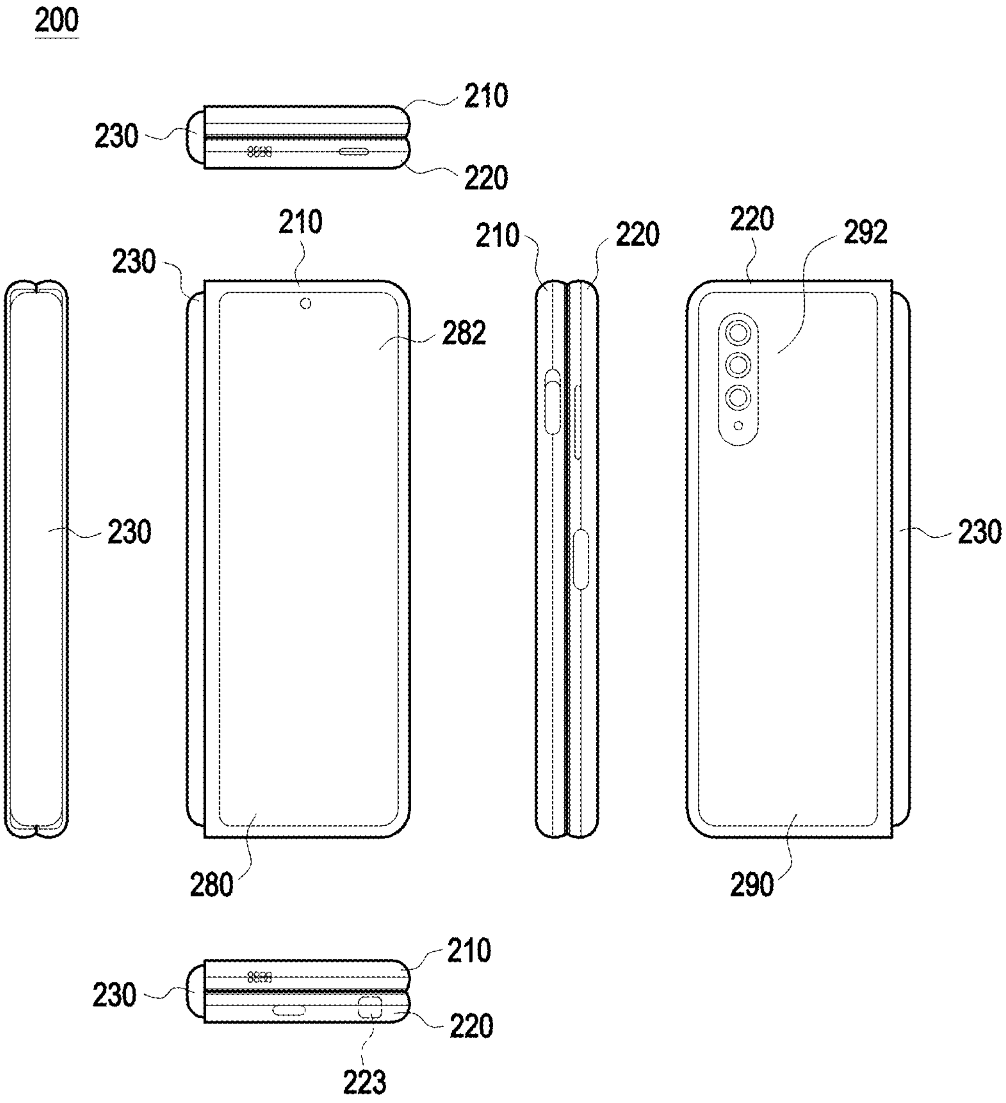
FIG. 2 is a diagram illustrating an electronic device in a folded state according to an embodiment of the disclosure.

FIG. 1 is a diagram illustrating an electronic device in an unfolded state according to an embodiment of the disclosure. FIG. 2 is a diagram illustrating the electronic device in a folded state according to an embodiment of the disclosure.

Referring to FIGS. 1 and 2, in an embodiment, an electronic device 200 may include a housing 201, a hinge cover 230 that covers a foldable portion of the housing 201, and a flexible or foldable display 240 (hereinafter, shortly referred to as a "display" 240) disposed in a space formed by the housing 201. According to an embodiment, a surface on which the display 240 is disposed is defined as a front surface (e.g., a first front surface 210*a* and a second front surface 220*a*) of the electronic device 200. Further, a surface opposite to the front surface is defined as a rear surface (e.g., a first rear surface 210*b* and a second rear surface 220*b*) of the electronic device 200. Further, a surface surrounding a space between the front and rear surfaces is defined as a side surface (e.g., a first side surface 211*a* and a second side surface 221*a*) of the electronic device 200.

Figure 3:
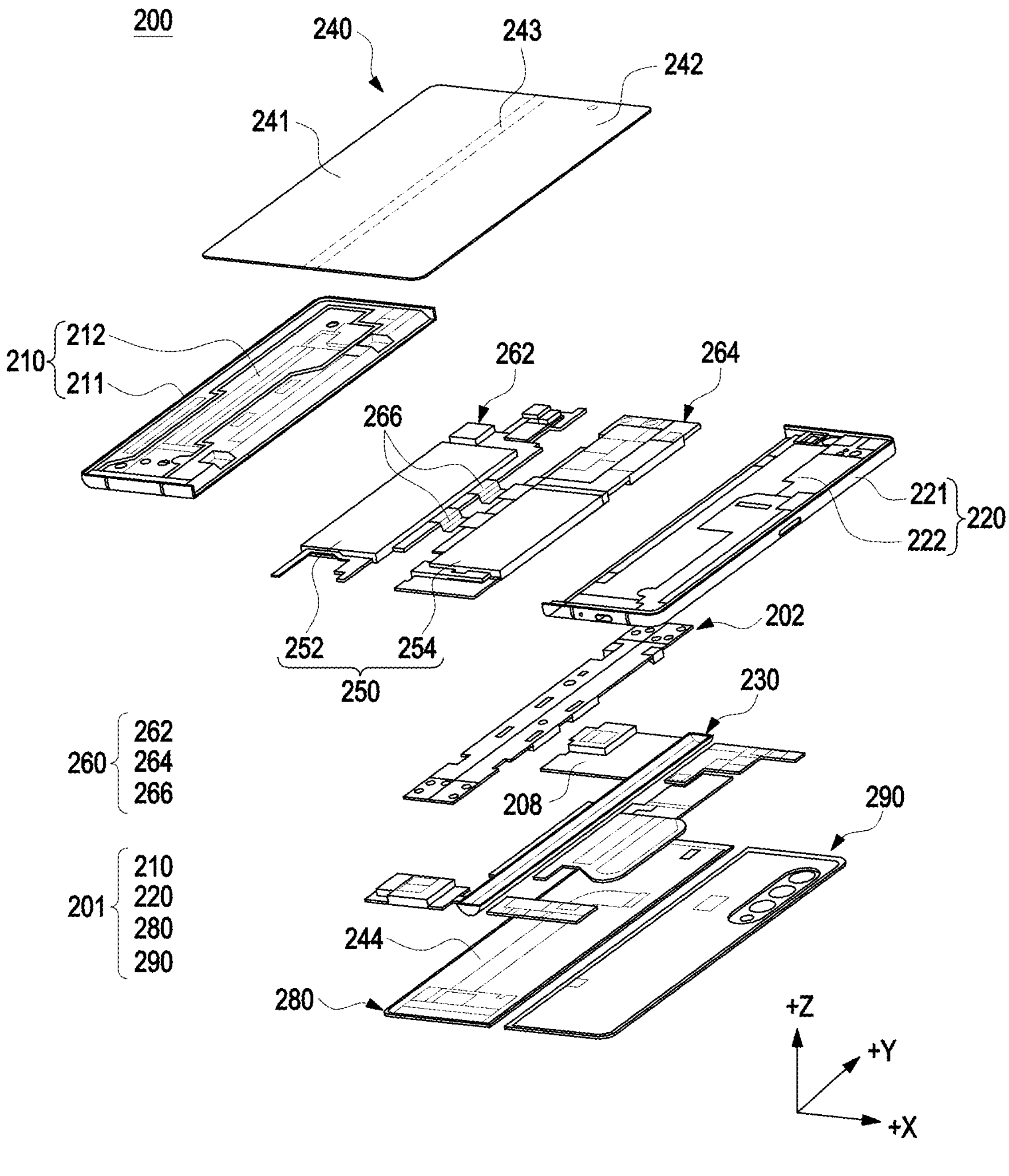
FIG. 3 is an exploded perspective view illustrating an electronic device according to an embodiment of the disclosure.

According to an embodiment, the housing 201 may include a first housing 210, a second housing 220 rotatably or pivotably coupled to the first housing 210, a first rear cover 280, a second rear cover 290, and a hinge module 202 (e.g., a hinge module 202 in FIG. 3). The hinge module 202 may provide at least one folding axis A which is the center of rotation of the first housing 210 and/or the second housing 220. The housing 201 of the electronic device 200 is not limited to the shape and coupling illustrated in FIGS. 2 and 3, and may be implemented in other shapes or other combinations and/or coupling of components. For example, in an embodiment, the first housing 210 and the first rear cover 280 may be formed integrally, and the second housing 220 and the second rear cover 290 may be formed integrally. According to various embodiments, the first housing 210 may be connected to the hinge module 202 (e.g., the hinge module 202 of FIG. 3) and include the first front surface 210*a* facing a first direction and the first rear surface 210*b* facing a second direction opposite to the first direction. The second housing 220 may be connected to the hinge module 202 (e.g., the hinge module 202 of FIG. 3), include the second front surface 220*a* facing a third direction and the second rear surface 220*b* facing a fourth direction opposite to the third direction, and rotate with respect to the first housing 210 around the hinge module 202. Accordingly, the electronic device 200 may be changed to and/or between the folded state or the unfolded state. When the electronic device 200 is in the folded state, the first front surface 210*a* may face the second front surface 220*a*. When the electronic device 200 is in the unfolded state, the third direction may be substantially parallel to the first direction. Unless otherwise stated, the directions will be described below based on the unfolded state of the electronic device 200.

According to an embodiment, the first housing 210 and the second housing 220 may be disposed on both sides of the folding axis A and have an overall symmetrical shape with respect to the folding axis A. As described later, an angle or distance between the first housing 210 and the second housing 220 may vary depending on whether the electronic device 200 is in the unfolded state, the folded state, or an intermediate state. According to an embodiment, unlike the first housing 210, the second housing 220 further includes a sensor area 224 in which various sensors (e.g., a front camera) are disposed, and otherwise the second housing 220 may have a symmetrical shape with the first housing 210 in the other area. According to an embodiment, the folding axis A may be a plurality of (e.g., two) parallel folding axes. In the disclosure, the folding axis A is provided along a longitudinal direction (Y-axis direction) of the electronic device 200, to which the direction of the folding axis A is not limited. For example, depending on an external design or a user's usage habits, the electronic device 200 may be understood as including the folding axis A extending along a width direction (e.g., X-axis direction). In these or other cases, the first housing 210 and the second housing 220 would each be rotatable around separate rotational axes separated from one another by a length defined along the width direction.

According to an embodiment, the electronic device 200 may include a structure into which a digital pen may be inserted. For example, a hole 223 into which the digital pen may be inserted may be formed on a side surface of the first housing 210 or the second housing 220 of the electronic device 200.

According to various embodiments, at least a portion of the first housing 210 and the second housing 220 may be formed of a metallic material or non-metallic material having a selected level of rigidity to support the display 240. At least a portion formed of the metallic material may provide a ground plane of the electronic device 200 and be electrically connected to a ground conductor provided on a printed circuit board (PCB) (e.g., a board unit 260 in FIG. 3).

According to various embodiments, the sensor area 224 may be formed to have a predetermined area adjacent to a corner of the second housing 220. However, the arrangement, shape, and size of the sensor area 224 are not limited to the illustrated example. For example, in an embodiment, the sensor area 224 may be provided in another corner of the first housing 210, in any area between top and bottom corners of the second housing or in the first housing 210. According to an embodiment, components for performing various functions built in the electronic device 200 may be visually exposed from the front surface of the electronic device 200 through the sensor area 224 or through one or more openings provided in the sensor area 224. In various embodiments, the components may include various types of sensors. The sensors may include, for example, at least one of a front camera, a receiver, or a proximity sensor.

According to various embodiments, the first rear cover 280 may be disposed on one side of the folding axis A on the rear surface of the electronic device 200, and have, for example, a substantially rectangular periphery, which may be surrounded by the first housing 210. Similarly, the second rear cover 290 may be disposed on the other side of the folding axis A on the rear surface of the electronic device 200, and have its periphery surrounded by the second housing 220.

According to various embodiments, the first rear cover 280 and the second rear cover 290 may have a substantially symmetrical shape with respect to the folding axis A. However, the first rear cover 280 and the second rear cover 290 do not necessarily have a mutually symmetrical shape, and in an embodiment, the electronic device 200 may include the first rear cover 280 and the second rear cover 290 of various shapes.

According to various embodiments, the first rear cover 280, the second rear cover 290, the first housing 210, and the second housing 220 may form a space in which various components (e.g., a PCB or a battery) of the electronic device 200 may be disposed. According to an embodiment, one or more components may be disposed or visually exposed on the rear surface of the electronic device 200. For example, at least a portion of a sub-display (e.g., a sub-display 244 in FIG. 3) may be visually exposed through a first rear area 282 of the first rear cover 280. In an embodiment, one or more components or sensors may be visually exposed through a second rear area 292 of the second rear cover 290. In various embodiments, the sensors may include a proximity sensor and/or a camera module 206 (e.g., a rear camera).

According to various embodiments, the front camera exposed from the front surface of the electronic device 200 through one or more openings provided in the sensor area 224 or the camera module 206 visually exposed through the second rear area 292 of the second rear cover 290 may include one or more lenses, an image sensor, and/or an image signal processor. In an embodiment, two or more lenses (an infrared camera, a wide-angle lens, and a telephoto lens) and image sensors may be disposed on one surface of the electronic device 200.

Referring to FIG. 2, the hinge cover 230 may be configured to be disposed between the first housing 210 and the second housing 220 to cover an internal component (e.g., the hinge module 202 in FIG. 3). According to an embodiment, the hinge cover 230 may be covered by a portion of the first hosing 210 and the second housing 220 or exposed to the outside, depending on the state (unfolded state or folded state) of the electronic device 200. For example, in the unfolded state, the hinge cover 230 may be substantially covered by the first housing 210 and the second housing 220, and in the folded state, most of an outer surface of the hinge cover 230 may be exposed to the outside.

According to an embodiment, when the electronic device 200 is in the unfolded state as illustrated in FIG. 1, the hinge cover 230 may be covered by the first housing 210 and the second housing 220 without being exposed. In another example, when the electronic device 200 is in the folded state (e.g., fully folded state) as illustrated in FIG. 2, the hinge cover 230 may be exposed to the outside between the first housing 210 and the second housing 220. In another example, when the first housing 210 and the second housing 220 are in the intermediate state in which they are folded with a certain angle, the hinge cover 230 may be partially exposed to the outside between the first housing 210 and the second housing 220. In this case, however, the exposed area may be less than in the fully folded state. In an embodiment, the hinge cover 230 may include a curved surface.

According to various embodiments, the display 240 may be disposed in the space formed by the housing 201. For example, the display 240 may be seated in a recess formed by the housing 201 and form most of the front surface of the electronic device 200. Accordingly, the front surface of the electronic device 200 may include the display 240 and partial areas of the first housing 210 and the second housing 220 adjacent to the display 240. The rear surface of the electronic device 200 may include a the first rear cover 280, a partial area of the first housing 210 adjacent to the first rear cover 280, the second rear cover 290, and a partial area of the second housing 220 adjacent to the second rear cover 290.

According to various embodiments, the display 240 may refer to a display in which at least a partial area is deformable into a flat or curved surface. According to an embodiment, the display 240 may include a folding area 243, a first display area 241 disposed on one side of the folding area 243 (e.g., the left side of the folding area 243 illustrated in FIG. 1), and a second display area 242 disposed on the other side of the folding area 243 (e.g., the right side of the folding area 243 illustrated in FIG. 1).

However, the division of the display 240 into areas is exemplary, and the display 240 may be divided into a plurality of areas (for example, four or more areas or two areas) depending on the structure or function thereof. For example, although in the embodiment illustrated in FIG. 1, the area of the display 240 may be divided by the folding area 243 or the folding axis A extending parallel to the Y axis, the display 240 may be divided into areas based on a different folding area (e.g., a folding area parallel to the X axis) or a different folding axis (e.g., a folding axis parallel to the X axis) in an embodiment. According to an embodiment, the display 240 may be coupled to or disposed adjacent to a touch detection circuit, a pressure sensor capable of measuring the intensity (pressure) of touch, and/or a digitizer (not shown) configured to detect a magnetic-field type stylus pen.

According to various embodiments, the first display area 241 and the second display area 242 may have an overall symmetrical shape with respect to the folding area 243. According to an embodiment (not shown), unlike the first display area 241, the second display area 242 may include a notch cut according to the presence of the sensor area 224. However, the second display area 242 may have a symmetrical shape with the first display area 241 in the other areas. In other words, the first display area 241 and the second display area 242 may include portions having a symmetrical shape and portions having an asymmetrical shape.

A description will be given of operations of the first housing 210 and the second housing 220 and each area of the display 240 according to the state (e.g., the unfolded or flat state, or the folded state) of the electronic device 200.

According to various embodiments, when the electronic device 200 is in the unfolded state as shown in FIG. 1, the first housing 210 and the second housing 220 may form an angle of substantially 180 degrees, and the first display area 241 and the second display area 242 may be disposed to face substantially the same direction. For example, in the unfolded state, a surface of the first display area 241 and a surface of the second display area 242 may form an angle of 180 degrees and face the same direction (e.g., a front direction of the electronic device). The folding area 243 may form the same plane as the first display area 241 and the second display area 242.

According to various embodiments, when the electronic device 200 is in the folded state as shown in FIG. 2, the first housing 210 and the second housing 220 may be disposed to face each other. The surface of the first display area 241 and the surface of the second display area 242 of the display 240 may form a narrow angle (e.g., between 0 degrees and 10 degrees) and substantially face each other. At least a portion of the folding area 243 may be formed as a curved surface with a predetermined curvature.

According to various embodiments, when the electronic device 200 is in the intermediate state, the first housing 210 and the second housing 220 may be disposed at a certain angle with respect to one another. The surface of the first display area 241 and the surface of the second display area 242 of the display 240 may form an angle larger than in the folded state and smaller than in the unfolded state. At least a portion of the folding area 243 may be formed as a curved surface with a predetermined curvature, and have a curvature smaller than that in the folded state.

FIG. 3 is an exploded perspective view illustrating an electronic device according to an embodiment of the disclosure.

Referring to FIG. 3, the electronic device 200 may include the housing 201, the display 240, the hinge module 202, the battery 250, and the board unit 260. The housing 201 may include the first housing 210, the second housing 220, the first rear cover 280, and the second rear cover 290.

According to various embodiments, the housing 201 may include the first housing 210, the second housing 220, the hinge cover 230, the first rear cover 280, and the second rear cover 290. The configurations of the first housing 210, the second housing 220, the hinge cover 230, the first rear cover 280, and the second rear cover 290 in FIG. 3 may be wholly or partially identical to those of the first housing 210, the second housing 220, the hinge cover 230, the first rear cover 280, and the second rear cover 290 in FIG. 1 and/or in FIG. 2. In an embodiment, the hinge module 202 may be disposed inside the housing 201 to pivotably connect the first housing 210 to the second housing 220.

According to various embodiments, the first housing 210 and the second housing 220 may be assembled to each other such that they are coupled to both sides of the hinge module 202. According to an embodiment, the first housing 210 may include a first support area 212 (e.g., a first support plate or a first support member) which may support components (e.g., a first circuit board 262 and/or a first battery 252) of the electronic device 200, and a first side wall 211 surrounding at least a portion of the first support area 212. The first side wall 211 may include the first side surface (e.g., the first side surface 211*a* in FIG. 2) of the electronic device 200. According to an embodiment, the second housing 220 may have a second support area 222 (e.g., a second support plate or a second support member) which may support components (e.g., a second circuit board 264 and/or a second battery 254) of the electronic device 200, and a second side wall 221 surrounding at least a portion of the second support area 222. The second side wall 221 may include the second side surface (e.g., the second side surface 221*a* in FIG. 2) of the electronic device 200.

According to an embodiment, the display 240 may include the first display area 241, the second display area 242, the folding area 243, and the sub-display 244. The configurations of the first display area 241, the second display area 242, and the folding area 243 in FIG. 3 may be wholly or partially identical to those of the first display area 241, the second display area 242, and the folding area 243 in FIG. 1 and/or FIG. 2.

According to an embodiment, the sub-display 244 may display a screen in a different direction from the display areas 241 and 242. For example, the sub-display 244 may output a screen in a direction opposite to the first display area 241. According to an embodiment, the sub-display 244 may be disposed on the first rear cover 280.

According to an embodiment, the battery 250 may include the first battery 252 disposed within the first housing 210 and the second battery 254 disposed within the second housing 220. According to an embodiment, the first battery 252 may be disposed on the first circuit board 262, and the second battery 254 may be disposed on the second circuit board 264.

According to an embodiment, the board unit 260 may include the first circuit board 262 disposed within the first housing 210 and the second circuit board 264 disposed within the second housing 220. According to an embodiment, the board unit 260 may include at least one flexible PCB (FPCB) 266 to electrically connect the first circuit board 262 to the second circuit board 264. According to an embodiment, at least a portion of the FPCB 266 may be disposed across the hinge module 202. According to an embodiment, the first circuit board 262 and the second circuit board 264 may be disposed inside a space formed by the first housing 210, the second housing 220, the first rear cover 280, and the second rear cover 290. Components for implementing various functions of the electronic device 200 may be disposed on the first circuit board 262 and the second circuit board 264.

According to an embodiment, the electronic device 200 may include a speaker module 208. According to an embodiment, the speaker module 208 may convert an electrical signal into sound. According to an embodiment, the speaker module 208 may be disposed inside the space formed by the first housing 210, the second housing 220, the first rear cover 280, and the second rear cover 290.

An exemplary configuration in which the first housing 210 and the second housing 220 are rotatably connected or coupled by the hinge module (or referred to as a 'hinge structure') has been described above. However, it is to be noted that this embodiment does not limit the electronic device according to an embodiment of the disclosure. For example, the electronic device according to an embodiment of the disclosure may include three or more housings, and "a pair of housings" in an embodiment described below may mean "two of three or more housings rotatably coupled to each other.

Although the electronic device 200 disclosed in FIGS. 1 to 3 has the appearance of a foldable electronic device, the disclosure is not limited thereto. For example, the illustrated electronic device may be a bar type, plate type, or rollable electronic device. The term "rollable electronic device" may refer to an electronic device with a display (e.g. the display 240 in FIG. 3) which is bendable and thus at least partially wound or rolled into a housing (e.g., the housing 201 in FIG. 1). Depending on the user's needs, the rollable electronic device may be used by unfolding the display or exposing a larger area of the display to the outside and thus extending a screen display area.

With reference to FIGS. 4 to 21, a wiring structure of the board unit 260 (e.g., the FPCB 266) according to various embodiments will be described below. In describing the embodiments of FIGS. 4 to 21, the electronic device 200 of the preceding embodiment may be referred to, like reference numerals or no reference numerals are assigned to components similar or identical to those in the preceding embodiment, and the detailed description of the components may also be omitted.

Figure 4:
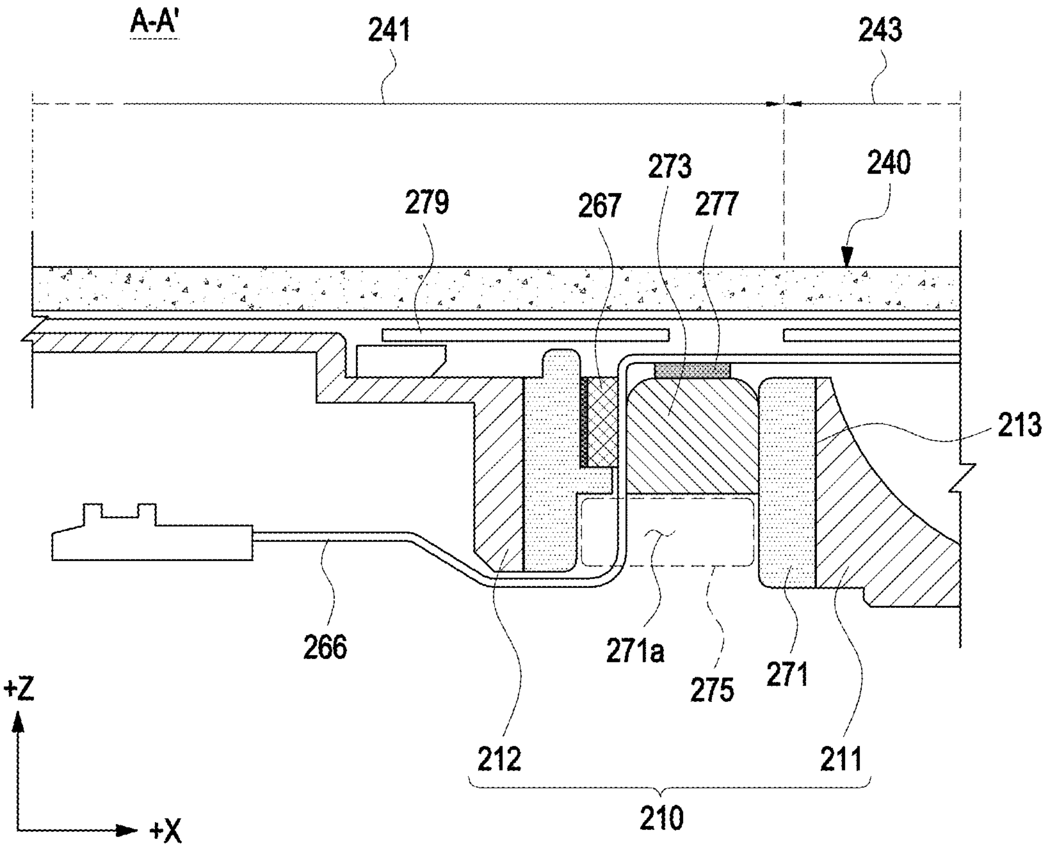
FIG. 4 is a cross-sectional view illustrating a wiring structure in an electronic device according to an embodiment of the disclosure.

FIG. 4 is a cross-sectional view illustrating a wiring structure in an electronic device according to an embodiment of the disclosure.

Figure 18:
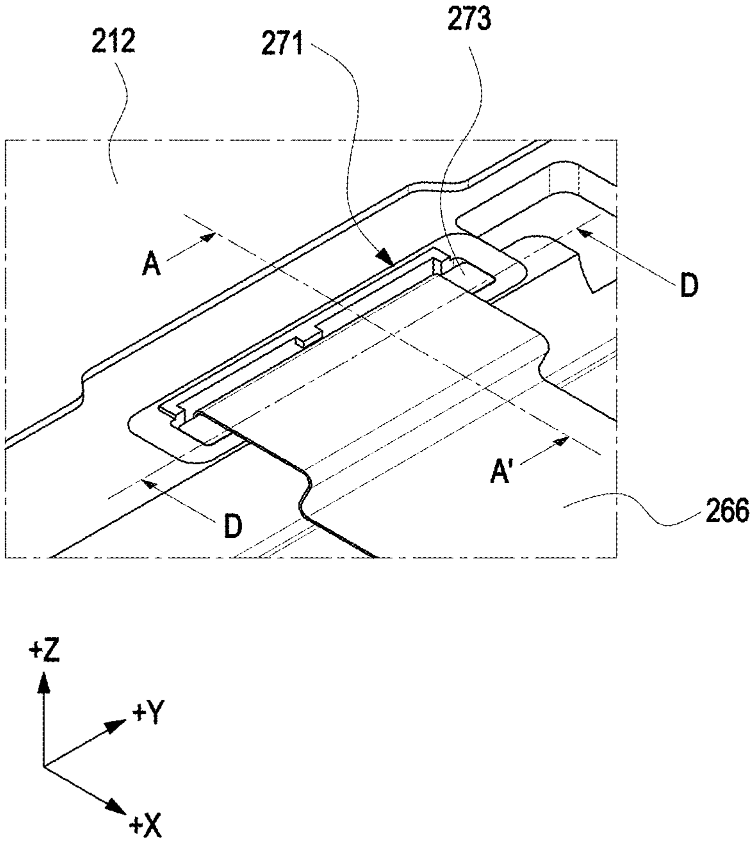
FIG. 18 is a perspective view a waterproof member disposed in an electronic device according to an embodiment of the disclosure.

FIG. 4 is a cross-sectional view illustrating a portion of the electronic device 200, for example, taken along line A-A' of FIG. 1 or 18. Referring to FIG. 4, the electronic device 200 (e.g., at least one of the first housing 210 or the second housing 220) may include a guide member 271, and the FPCB 266 may be wired from the outside into the first housing 210 or the second housing 220, passing through the guide member 271. In the following detailed description, a wiring structure of the FPCB 266 may be described, generally taking the first housing 210 as an example. However, this exemplary description does not limit an embodiment of the disclosure, and a wiring structure of a later-described embodiment may be implemented in the second housing 220 in substantially the same manner.

According to an embodiment, the electronic device 200, for example, the first housing 210 may include a support plate (e.g., the first support area 212 in FIG. 3), and the support plate may form or define a through hole 213. For example, the through hole 213 may be formed to penetrate both surfaces of the first support area 212, and the guide member 271 may be disposed to at least partially surround an inner wall of the through hole 213. For example, when viewed from the front surface or rear surface of the first support area 212 along a Z-axis direction, the guide member 271 may have a closed curve shape surrounding the entire inner wall of the through hole 213. In an embodiment, the guide member 271 may provide a wiring path (e.g., a wiring hole 271*a*) for the FPCB 266 and include a synthetic resin material, thereby suppressing or mitigating damage to the FPCB 266 in spite of contact or friction with the FPCB 266. When the through hole 213 is formed in a metal portion of the first support area 212, and the guide member 271 includes a synthetic resin material, the guide member 271 may be coupled to the first housing 210 simultaneously with molding through an insert molding process. However, an embodiment of the disclosure is not limited thereto, and the guide member 271 may be fabricated separately from the first housing 210 and then disposed within the through hole through an assembly process.

According to an embodiment, the FPCB 266 may extend from the first housing 210 to the second housing 220 across an area or space in which a hinge module (e.g., the hinge module 202 in FIG. 3) is disposed. For example, in the first housing 210 and/or the second housing 220, the through hole 213 or the guide member 271 may be formed at a position substantially adjacent to the hinge module 202. In an embodiment, the FPCB 266 may be disposed between the first sidewall 211 and the display 240 and/or between the first support area 212 and the display 240 outside the first housing 210, and extend into the first housing 210 through the through hole 213 and/or the guide member 271. In an embodiment, as the FPCB 266 is flexible, it may be deformed into a shape corresponding to relative movement or displacement (e.g., rotation) of the first housing 210 and the second housing 220. For example, the FPCB 266 may allow for relative movement or displacement of the first housing 210 and the second housing 220, while maintaining an electrical connection state between the first housing 210 and the second housing 220.

According to an embodiment, the electronic device 200 and/or the FPCB 266 may include a fixing plate 267, which may standardize a deformed position or shape of the FPCB 266. For example, when the exterior shape of the electronic device 200 is changed, the FPCB 266 may be deformed in the area where the hinge module 202 is disposed (e.g., inside the hinge cover 230 in FIG. 3), while remaining in a specified shape in other areas or spaces. Therefore, in spite of the deformation of the FPCB 266, interference or friction between the FPCB 266 and other mechanical structures may be suppressed or mitigated.

According to an embodiment, the fixing plate 267 may include at least one of a synthetic resin material or a metal material and be fixed to one surface of the FPCB 266. When the FPCB 266 is wired through the wiring hole 271*a*, the fixing plate 267 may be disposed on an inner wall of the guide member 271 and/or wiring hole 271*a* and thus substantially fixed to the inner wall of the wiring hole 271*a*. According to an embodiment, the FPCB 266 may be partially bonded to a later-described waterproof member 273 outside the first housing 210, and this bonded portion or the fixing plate 267 may restrain an elastic or repulsive force generated from deformation of the FPCB 266 from being applied to a portion of the FPCB 266 disposed inside the first housing 210. Accordingly, the FPCB 266 may be maintained in a specified shape at least from the position where the fixing plate 267 is disposed to the inside of the first housing 210.

According to an embodiment, the electronic device 200 may further include a guide plate 279 disposed between the display 240 and the first support area 212 (e.g., the support plate) and/or between the display 240 and the FPCB 266 at least outside the first housing 210. For example, the guide plate 279 may prevent contact between the display 240 and the FPCB 266. According to an embodiment, a portion of the FPCB 266 disposed between the first sidewall 211 (or the first support area 212) and the display 240 may be deformed according to relative movement or displacement of the first housing 210 and the second housing 220. The guide plate 279 may protect the display 240 and/or the FPCB 266 by blocking the deformed FPCB 266 from contacting the display 240. In an embodiment, the guide plate 279 may be a structure which is a portion of the hinge module 202 and is fixed to the first housing 210 or the second housing 220.

According to an embodiment, in standardizing the deformation of the FPCB 266, an internal space of the first housing 210 and/or the second housing 220 may be efficiently used by disposing the fixing plate 267 within the wiring hole 271*a*. In an embodiment, it may be easier to standardize the deformation of the FPCB 266, when the fixing plate 267 is disposed closer to the hinge module 202 outside the first housing 210. In this case, however, the through hole 213 and/or the wiring hole 271*a* may be disposed away at a distance from the hinge module 202 and may be located on an inner side of the first housing 210 (and/or the second housing 220). For example, the wiring space of the FPCB 266 may reduce design freedom in arrangement or partitioning of a space for other electrical/electronic components within the first housing 210, and degrade battery performance (e.g., power capacity) which is highly affected by shape and volume.

In an embodiment of the disclosure, the fixing plate 267 may be disposed on the inner wall of the wiring hole 271*a* and aligned to be in an inclined position with or to be substantially perpendicular with the display 240 (e.g., the first display area 241 or the second display area 242), such that the wiring space (e.g., the through holes 213 and/or the wiring holes 271*a*) of the FPCB 266 may be disposed adjacent to an edge (e.g., the first sidewall 211) on the first housing 210. For example, the wiring structure of the FPCB 266 may be useful in securing a battery capacity and enhance design freedom in arranging electrical/electronic components within the first housing 210.

According to an embodiment, the electronic device 200 and/or the first housing 210 may further include the waterproof member 273 disposed within the wiring hole 271*a*, and the waterproof member 273 may include, for example, an elastic material such as rubber, silicone, or urethane. According to an embodiment, the waterproof member 273 may be understood as an elastic member, a pressing member, and/or a sealing member. In an embodiment, the waterproof member 273 may be disposed within the wiring hole 271*a* to closely contact an inner wall of the wiring hole 271*a* or press the FPCB 266 and bring the fixing plate 267 into close contact with the inner wall of the wiring hole 271*a* or fix the fixing plate 267 to the inner wall of the wiring hole 271*a*. Within the wiring hole 271*a*, the waterproof member 273 may be compressed from an initial size to a smaller specific size. For example, although the waterproof member 273 is fabricated in a size greater than the wiring hole 271*a*, the waterproof member 273 may form a waterproof structure within the wiring hole 271*a* due to an elasticity of a material of the waterproof member 273.

According to an embodiment, in the case of a structure in which a portion of the FPCB 266 is bonded to the waterproof member 273 outside the first housing 210, the waterproof member 273 may be disposed at least partially in an area between the fixing plate 267 and the hinge module 202 or in an area between the FPCB 266 and the hinge module 202. For example, the FPCB 266 may contact a portion of a surface of the waterproof member 273 inside the wiring hole 271*a* and be bonded to the waterproof member 273 outside the first housing 210. According to an embodiment, the electronic device 200 may further include a bonding member 277 (e.g., a double-sided tape) disposed between the display 240 and the waterproof member 273, and the bonding member 277 may bond a portion of the FPCB 266 to the waterproof member 273. In an embodiment, the bonding member 277, together with the guide plate 279, may suppress or prevent contact between the FPCB 266 and the display 240 outside the first housing 210.

According to an embodiment, the electronic device 200 and/or the first housing 210 may further include a bonding material 275 filled in the wiring hole 271*a* and/or cured in the wiring hole 271*a*. The bonding material 275, for example, together with the waterproof member 273, may seal the wiring hole 271*a* to increase waterproof performance, and the waterproof member 273 may be disposed between the bonding material 275 and the display 240. In an embodiment, the waterproof member 273 may be omitted and the bonding material 275 may be disposed in the wiring hole 271*a*, thereby providing a waterproof structure. However, the waterproof member 273 may be more useful for fixing the FPCB 266 or the fixing plate 267 within the wiring hole 271*a*. In an embodiment, to increase the waterproof performance, the electronic device 200 and/or the first housing 210 may further include a double-sided tape or liquid silicone provided on a surface of the waterproof member 273. For example, within the wiring hole 271*a*, the waterproof member 273 may be bonded to the inner wall of the wiring hole 271*a* and/or the FPCB 266.

Figure 5:
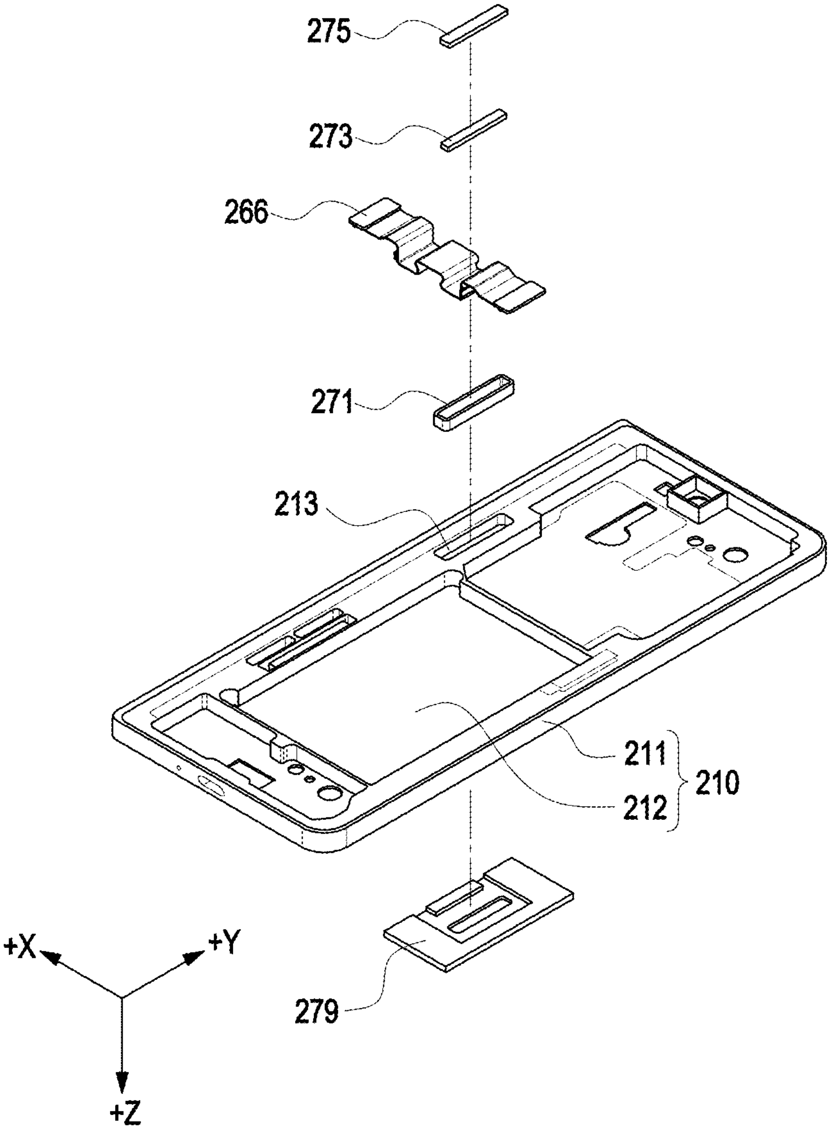
FIG. 5 is an exploded perspective view illustrating a wiring structure in an electronic device according to an embodiment of the disclosure.
Figure 6:
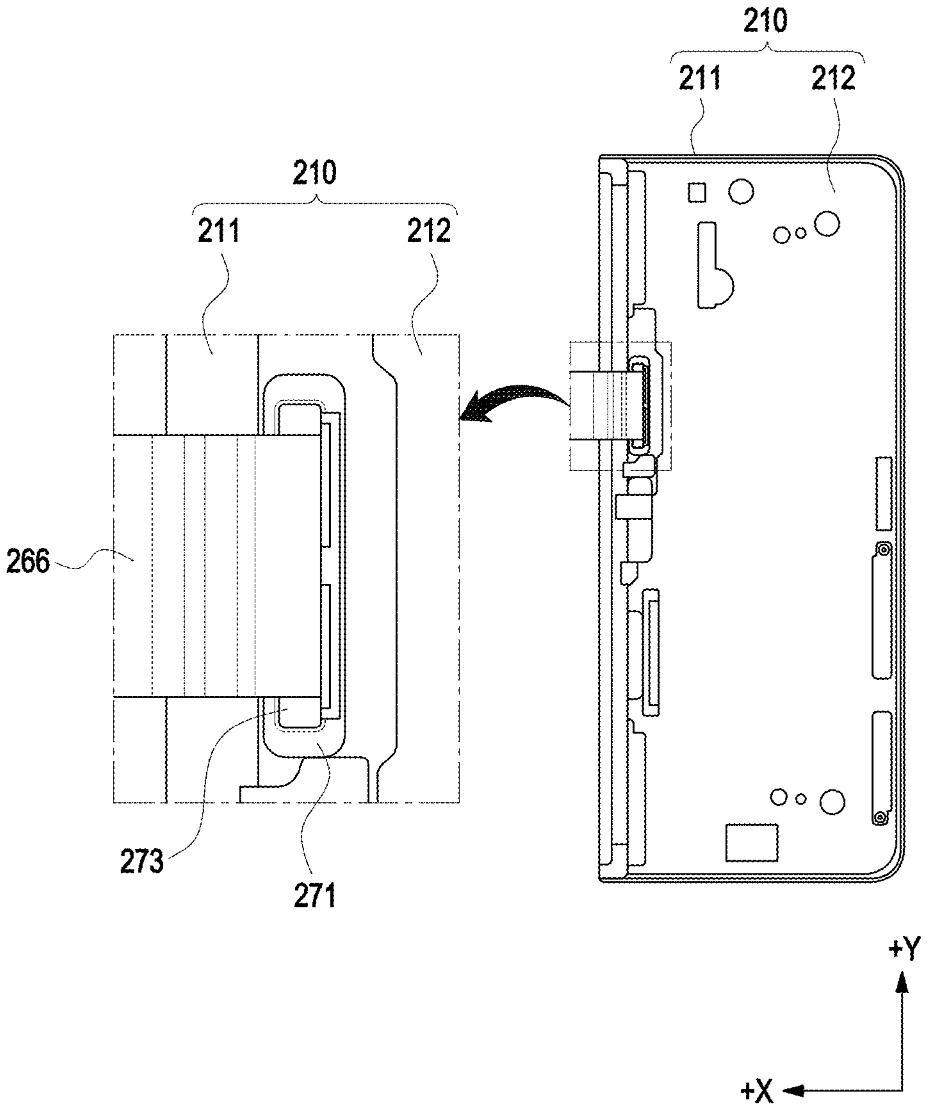
FIG. 6 is a front view illustrating a wiring structure in an electronic device according to an embodiment of the disclosure.
Figure 7:
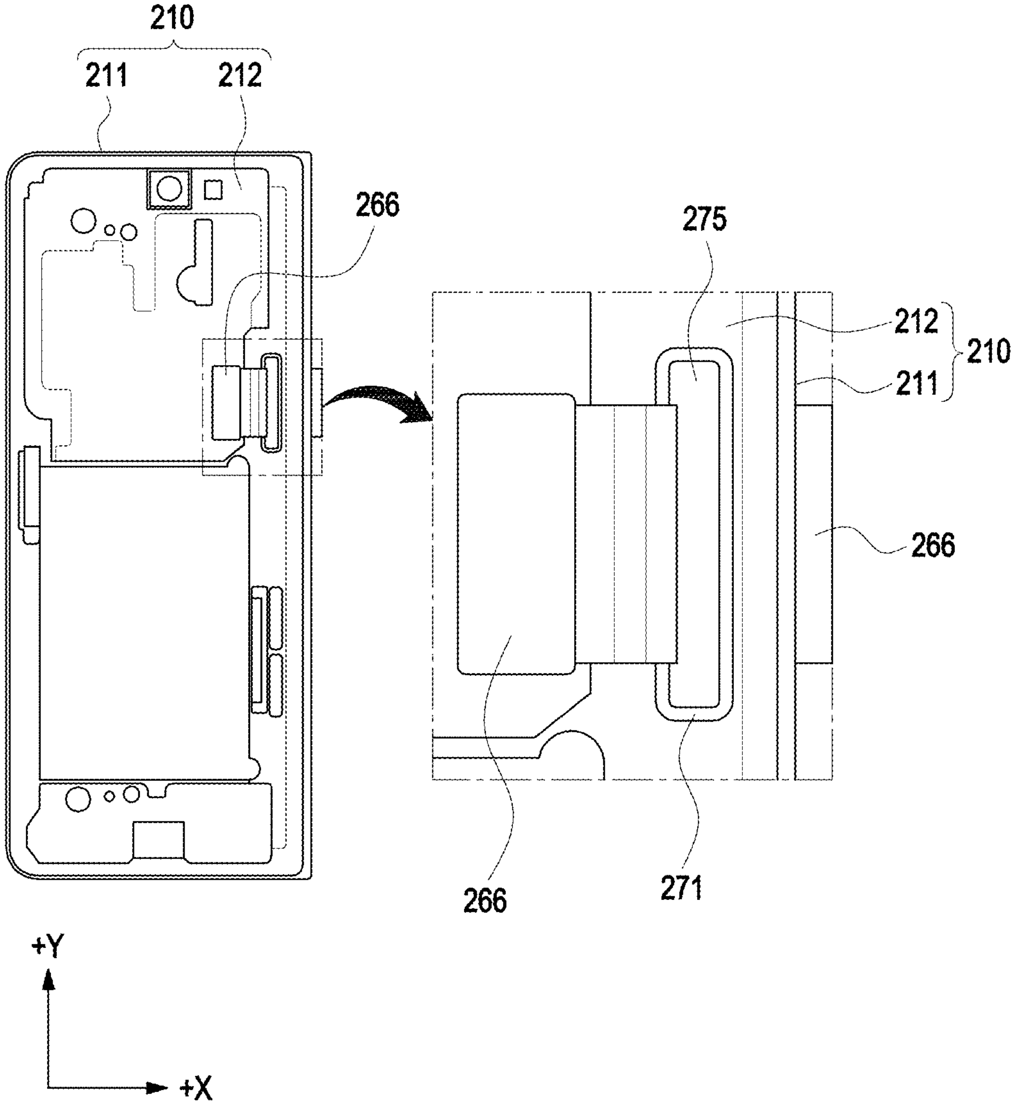
FIG. 7 is a rear view illustrating a wiring structure in an electronic device according to an embodiment of the disclosure.

FIG. 5 is an exploded perspective view illustrating a wiring structure in an electronic device according to an embodiment of the disclosure. FIG. 6 is a front view illustrating the wiring structure in the electronic device according to an embodiment of the disclosure. FIG. 7 is a rear view illustrating the wiring structure in the electronic device according to an embodiment of the disclosure.

While FIG. 5 illustrates, for example, a rear view of the first housing 210, the second housing 220 may be similar in terms of wiring the FPCB 266. For example, while the illustrated embodiment shows the first housing 210, the embodiment of FIGS. 5 to 7 may be understood to describe the configuration of the second housing 220.

Referring to FIGS. 5 to 7, the wiring structure of the FPCB 266 may be implemented through the through hole 213 and/or the guide member 271, and as the fixing plate 267 is disposed within the wiring hole 271*a*, a design in which the through hole 213 and/or the guide member 271 is disposed adjacent to an edge of the first housing 210 may be facilitated. Accordingly, design freedom in arranging electrical/electronic components within the electronic device 200 may be enhanced, and it may be easy to secure a battery capacity.

In an embodiment, the FPCB 266 may be wired from the front surface outside the first housing 210 into the first housing 210 through the through hole 213 (or the wiring hole 271*a* in FIG. 4). In an embodiment, outside the first housing 210, the FPCB 266 may extend from the through hole 213 and/or the guide member 271 across the first sidewall 211 into the area or space where the hinge module 202 is disposed (e.g., inside the hinge cover 230 in FIG. 3) (see FIG. 6). Although not shown, after crossing the area where the hinge module 202 is disposed, the FPCB 266 may be wired across a second sidewall (e.g., the second sidewall 221 in FIG. 3) and then from the front surface of the second housing 220 into the second housing 220 through a through hole (e.g., the through hole 213 in FIG. 4) formed in the second support area 222.

According to an embodiment, when the through hole 213 is formed in the metal portion of the first housing 210, the guide member 271 made of a synthetic resin material may be disposed to at least partially surround the inner wall of the through hole 213 to suppress or prevent the FPCB 266 from directly contacting the inner wall (e.g., metal portion) of the through hole 213. When the FPCB 266 is disposed on the first housing 210, a fixing plate (e.g., the fixing plate 267 in FIG. 4) may be disposed on the inner wall of the wiring hole 271*a* and may set or fix an assembly position of the FPCB 266. In an embodiment, the electronic device 200 may further include the waterproof member 273 disposed in the wiring hole 271*a* to implement a waterproof structure on the guide member 271. In an embodiment, as the waterproof member 273 is disposed, a portion of the FPCB 266 and/or the fixing plate 267 may be fixed substantially within the wiring hole 271*a*.

According to an embodiment, the waterproof member 273 may be assembled in the wiring hole 271*a* in a direction from the rear surface (e.g., internal space) of the first housing 210 toward the front surface thereof (e.g., the outside), and a portion of the FPCB 266 may be attached to the waterproof member 273 on the front surface of the first housing 210. The bonding material 275 may be filled into the wiring hole 271*a* from the rear surface of the first housing 210, with the waterproof member 273 assembled in the wiring hole 271*a*. In FIG. 5, the bonding material 275 is shown as being in a cured state, and may be in a liquid phase or a gel phase prior to curing.

According to an embodiment, the electronic device 200 and/or the first housing 210 may further include the guide plate 279, which may be disposed on an outer surface of the first support area 212. For example, the FPCB 266 may be visually concealed by the guide plate 279 from the outside of the first housing 210. In an embodiment, the guide plate 279 may be disposed between the display 240 (e.g., the first display area 241 in FIG. 3) and the FPCB 266.

Figure 8:
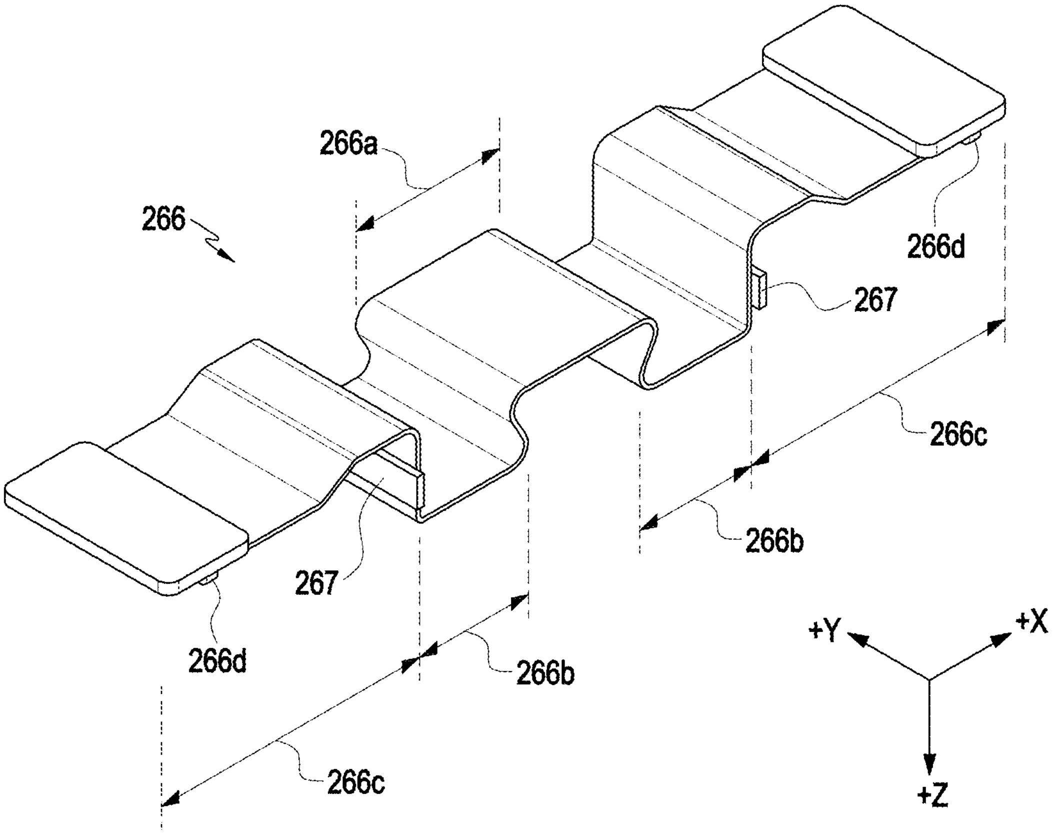
FIG. 8 is a perspective view illustrating a flexible printed circuit board in an electronic device according to an embodiment of the disclosure.
Figure 9:
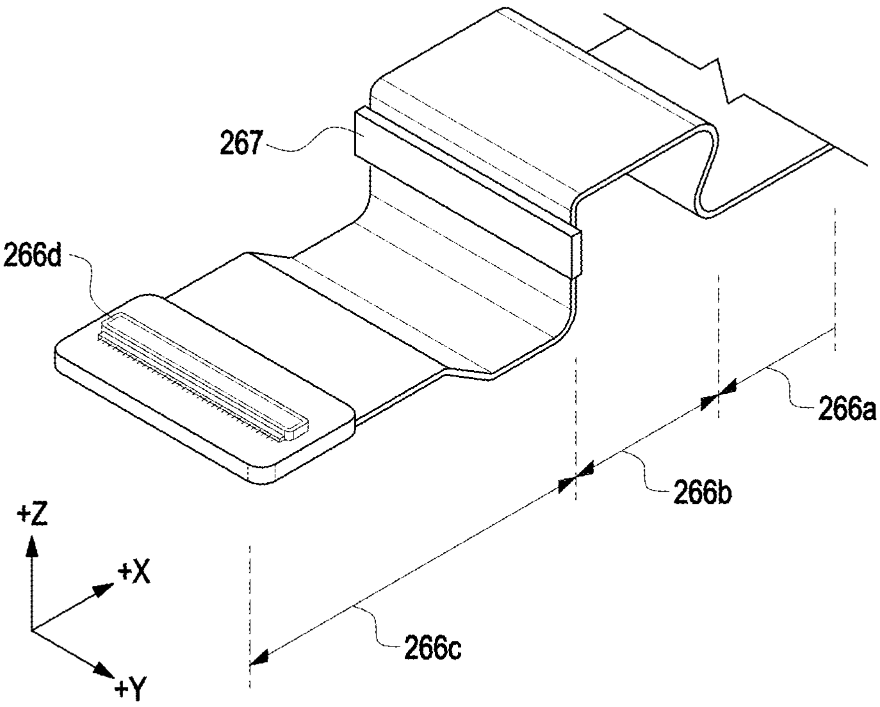
FIG. 9 is a perspective view illustrating a flexible printed circuit board viewed from a different direction in an electronic device according to an embodiment of the disclosure.

FIG. 8 is a perspective view illustrating an FPCB in an electronic device according to an embodiment of the disclosure. FIG. 9 is a perspective view illustrating the FPCB viewed from a different direction in the electronic device according to an embodiment of the disclosure.

Referring to FIGS. 8 and 9, the FPCB 266 may extend in one direction and have a curved shape corresponding to a wiring path in the electronic device 200. For example, the FPCB 266 may include a variable portion 266*a* disposed to at least partially surround or cross the hinge module 202, first portion(s) 266*b* extending from both ends of the variable portion 266*a*, and/or second portion(s) 266*c* extending from the first portion(s) 266*b*, and include a connector 266*d* disposed on one surface of a second portion 266*c* to electrically connect to a circuit board (e.g., the first circuit board 262 or the second circuit board 264 in FIG. 3) within the first housing 210 or the second housing 220.

According to an embodiment, the variable portion 266*a* may be disposed to surround a portion of the hinge module 202 inside the hinge cover (e.g., the hinge cover 230 in FIG. 3), while being formed or provided substantially in the shape of alphabet "U". The first portion may extend from the variable portion 266*a* and be disposed across a sidewall (e.g., the first sidewall 211 or the second sidewall 221 in FIG. 3) of the first housing 210 (or the second housing 220). In an embodiment, a portion of the first portion 266*b* may be disposed between a support plate (e.g., the first support area 212 or the second support area 222 in FIG. 3) and the display 240 or disposed on the guide member 271. In an embodiment, when the electronic device 200 includes a bonding member (e.g., the bonding member 277 in FIG. 4), the first portion 266*b* may be partially attached to the waterproof member 271. The second portion 266*c* may extend from the first portion 266*b*, pass through a wiring hole (e.g., the wiring hole 271*a* in FIG. 4), and be disposed on a rear side of the first support area 212 or inside the first housing 210. For example, the second portion 266*c* or the connector 266*d* may be coupled to the first circuit board 262 inside the first housing 210.

To whatever extent FIG. 8 illustrates the variable portion 266*a*, the first portions 266*b*, the second portions 266*c* and the connectors 266*d* as having discrete and defined formations, it is to be understood that this is merely exemplary and that other embodiments exist. For example, the FPCB 266 as a whole can have a ribbon-shape. As another example, the FPCB 266 can assume any shape or configuration that conforms to the complementary shapes and configurations of the first housing 210 and the second housing 220 and their respective components.

According to an embodiment, the fixing plate 267 may be disposed on one surface of the FPCB 266 at the second portion 266*b*. In an embodiment, the fixing plate 267 may include a pair of plates coupled to face each other with the first portions 266*b* and the variable portion 266*a* therebetween and inside the second portions 266*c* and the connectors 266*d*. In the illustrated embodiment, a single plate is shown as disposed on one surface of the FPCB 266. In an embodiment, as a double-sided tape or an adhesive is provided to a surface of the fixing plate 267, the fixing plate 267 may be attached to the inner wall of the wiring hole 271*a* (e.g., a seating groove 271*b* in FIG. 12). When disposed on the inner wall of the wiring hole 271*a*, the fixing plate 267 may be disposed inclined or substantially perpendicular to the first display area 241 or the second display area 242.

Figure 10:
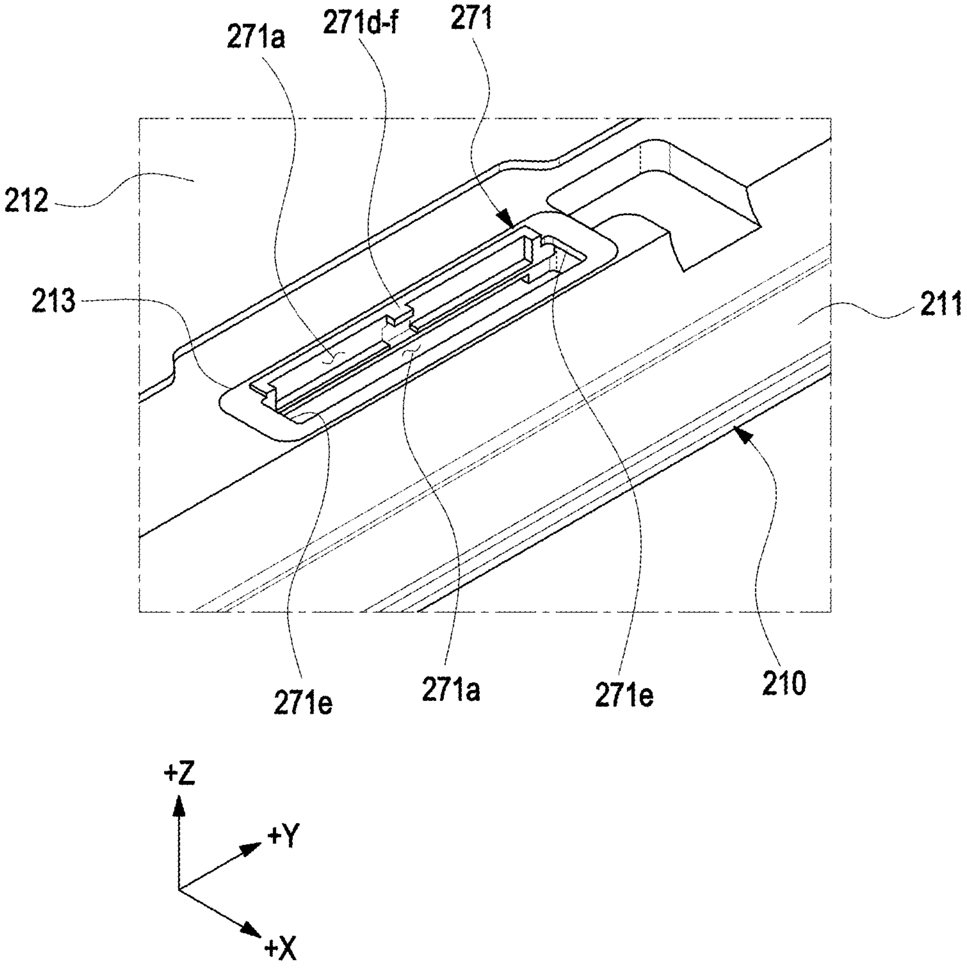
FIG. 10 is a perspective view illustrating a guide member disposed in an electronic device according to an embodiment of the disclosure.
Figure 11:
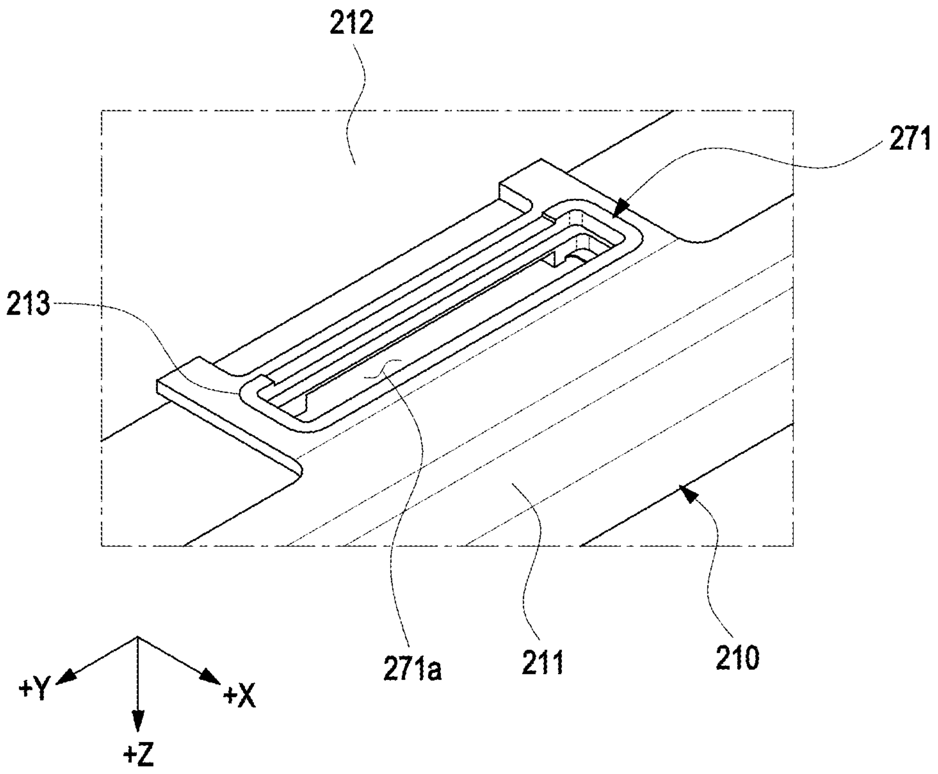
FIG. 11 is a perspective view illustrating a guide member viewed from a different direction in an electronic device according to an embodiment of the disclosure.
Figure 12:
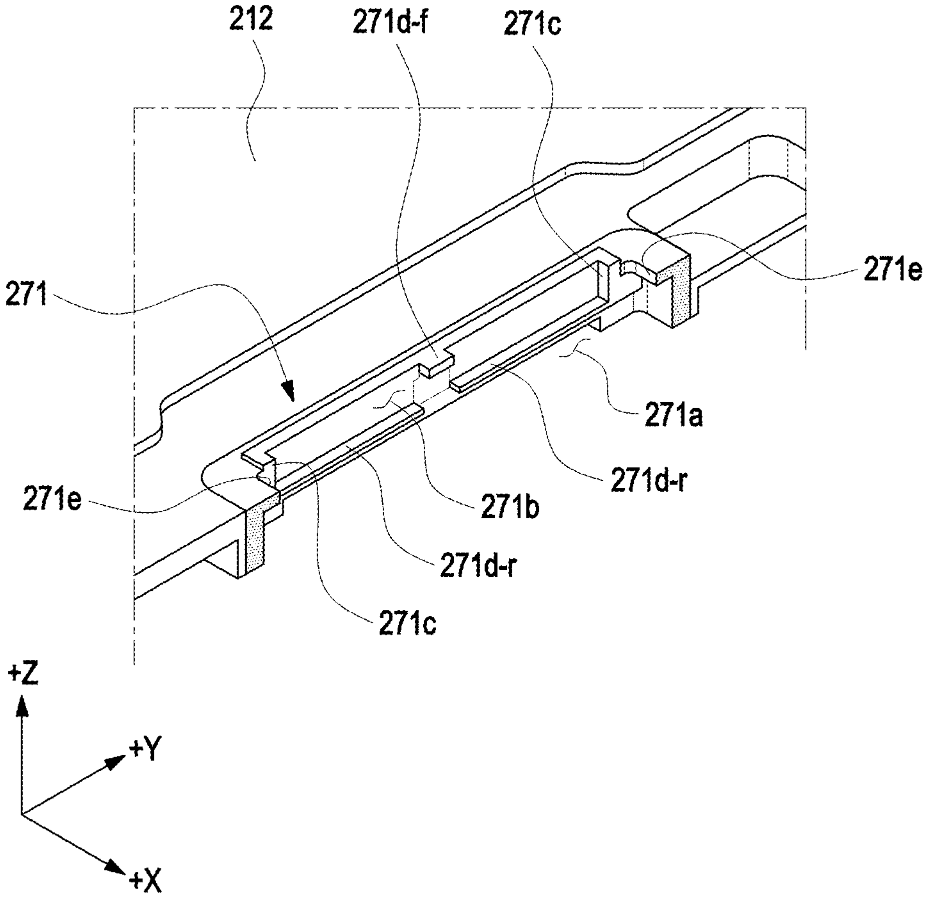
FIG. 12 is a cross-sectional perspective view illustrating a cut portion of the guide member of FIG. 10.

FIG. 10 is a perspective view illustrating a guide member disposed in an electronic device according to an embodiment of the disclosure. FIG. 11 is a perspective view illustrating the guide member viewed from a different direction in the electronic device according to an embodiment of the disclosure. FIG. 12 is a cross-sectional perspective view illustrating a cut portion of the guide member of FIG. 10.

Referring to FIGS. 10 to 12, the guide member 271, which has a closed curve shape when viewed from the front surface or rear surface of the first support area 212, may be disposed to surround the inner wall of the through hole 213. For example, even though the FPCB 266 is wired through the through hole 213, it may not contact a metal structure around the through hole 213. In an embodiment, the guide member 271 may include the seating groove 271*b* formed in an area of the inner wall of the wiring hole 271*a*, which faces the direction in which the hinge module 202 is disposed. For example, the seating groove 271*b* may be at least partially surrounded by stopper wall(s) 271*c* and/or stopper rib(s) 271*d-f* and 271*d-r* disposed around the perimeter thereof or at edges thereof, and determine an assembly position of the fixing plate 267 in a thickness direction (e.g., in the Z-axis direction in FIG. 3) or a longitudinal direction (e.g., in a Y-axis direction in FIG. 3). For example, the fixing plate 267 may be fixed substantially in the wiring hole 271*a* in the Z-axis direction and/or the Y-axis direction by being disposed in the seating groove 271*b*.

According to an embodiment, a pair of stopper walls 271*c* may be formed to face each other in the Y-axis direction, for example, in a direction side by side with or substantially parallel to the folding axis A. For example, the seating groove 271*b* may be recessed into the inner wall of the wiring hole 271*a*, and thus the stopper walls 271*c* may be formed to face each other, and in an embodiment, it may be understood that the stopper walls 271*c* protrude from the inner wall of the wiring hole 271*a* to form portions of edges of the seating groove 271*b*. In an embodiment, the fixing plate 267 may be fixed in the Y-axis direction by being disposed between the stopper walls 271*c*.

In an embodiment, the stopper ribs 271*d-f* and 271*d-r* may be illustrated as protruding from the inner wall of the wiring hole 271*a* at edges of the seating groove 271*b*, and at least one pair of stopper ribs may be aligned to face each other in the Z-axis direction, for example, in a direction intersecting or substantially perpendicular to the folding axis A. In the illustrated embodiment, the stopper rib denoted by "271*d-f*" may be located on a front side of the first housing 210 and aligned with the stopper ribs (e.g., the stopper ribs denoted by "272*d-r*") located on a rear side of the first housing 210 in the direction intersecting the folding axis A. It is to be noted that the stopper ribs 271*d-f* and 271*d-r* have different widths and lengths, and the positions of the stopper ribs 271*d-f* and 271*d-r* differ somewhat from the description of "aligned to face each other in the direction intersecting or substantially perpendicular to the folding axis A" in the illustrated embodiment. In an embodiment of the disclosure, "aligned to face each other in the direction intersecting or substantially perpendicular to the folding axis A" may be understood to mean that when the fixing plate 267 is disposed in the seating groove 271*b*, the stopper ribs 271*d-f* and 271*d-r* restrict movement of the fixing plate 267 in the direction intersecting the folding axis A. For example, even if the stopper ribs 271*d-f* and 271*d-r* do not face each other directly in the direction intersecting or substantially perpendicular to the folding axis A, the number, shapes, sizes, and/or positions of the stopper ribs 271*d-f* and 271*d-r* may be designed to vary, as far as the fixing plate 267 is disposed between the stopper rib 271*d-f* on the front side and the stopper ribs 271*d-r* on the rear side and thus substantially fixed in the direction intersecting the folding axis A.

In an embodiment, at least one of the stopper ribs 271*d-f* and 271*d-r* may extend side-by-side with or substantially parallel to the folding axis A or the Y axis and may be connected to the stopper walls 271*c*. In an embodiment, the stopper ribs 271*d-r* on the rear side may be disposed closer to the stopper rib 271*d-f* on the front side than the rear surface of the first support area 212. For example, the stopper ribs 271*d-r* on the rear side may be located on the inner side of the wiring hole 271*a* at a specified spacing from the rear surface of the first support area 212. In an embodiment, when formed at a specified spacing from the rear side of the first support area 212, the stopper ribs 271*d-r* on the rear side may be portions of a structure where that structure configures a space in which the bonding material 275 is filled.

According to an embodiment, the electronic device 200 and/or the guide member 271 may further include guide stopper(s) 271*e* formed on the inner wall of the wiring hole 271*a*. The guide stopper(s) 271*e* may protrude from the inner wall of the wiring hole 271*a*, for example, at a location adjacent to the front side of the first support area 212. For example, in a structure where the waterproof member 273 is assembled into the wiring hole 271*a* from the rear surface of the first housing 210, the guide stopper(s) 271*e* may guide or determine an assembly position of the waterproof member 273. In an embodiment, the guide stopper(s) 271*e* may be understood as a portion of the stopper ribs 271*d-f* and 271*d-r* (e.g., the stopper rib 271*d-f* on the front side). As far as the guide stopper(s) 271*e* does not interfere with the FPCB 266 in the wiring hole 217*a*, the shape, number, or position of the guide stopper(s) 271*e* may be designed to vary.

Figure 13:
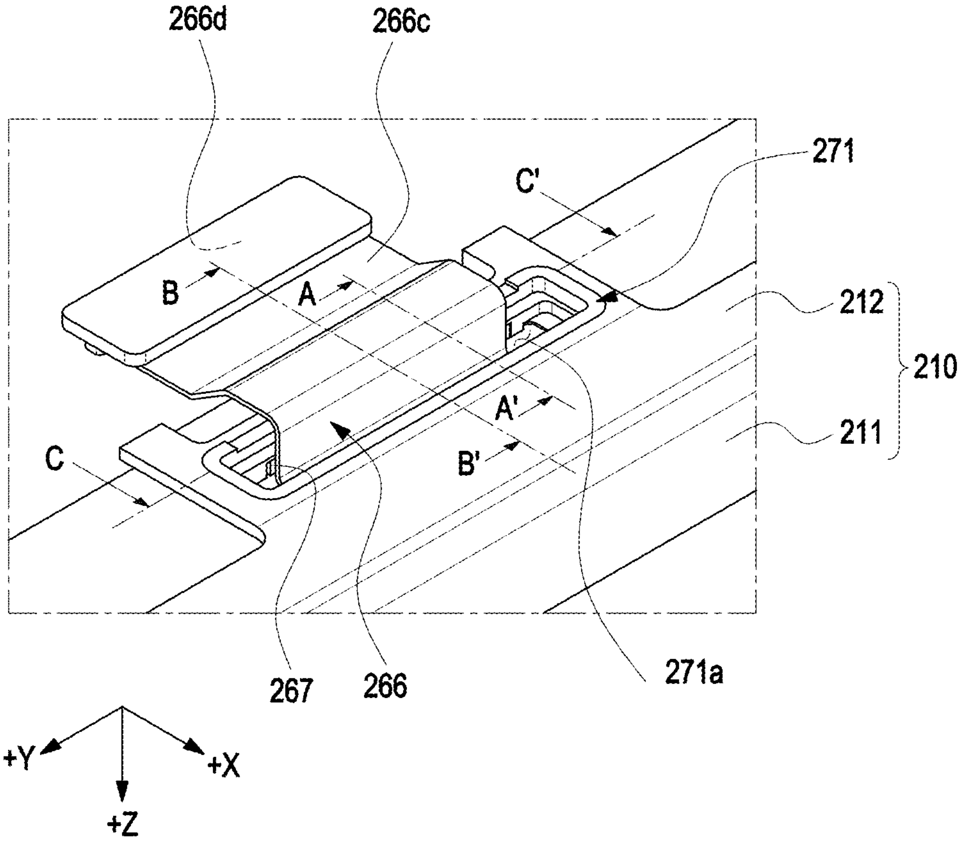
FIG. 13 is a perspective view illustrating a flexible printed circuit board disposed in the guide member of FIG. 10.
Figure 14:
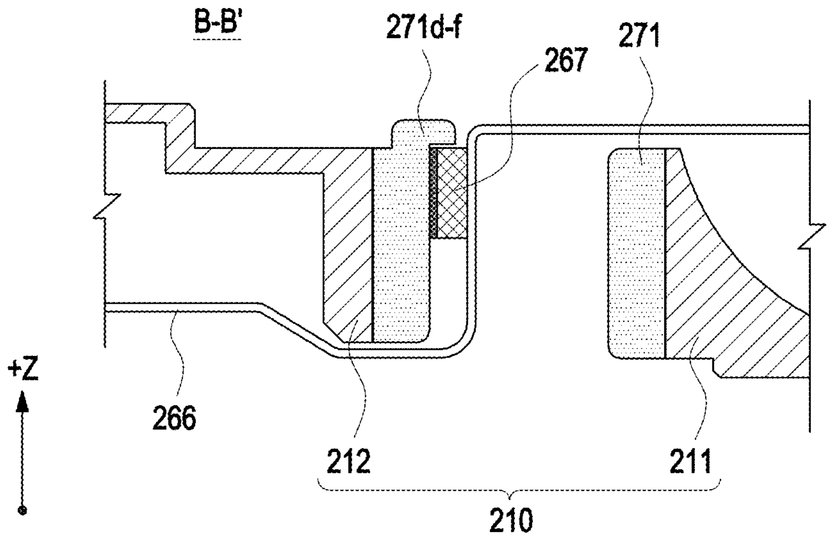
FIG. 14 is a cross-sectional view illustrating the guide member and/or the flexible printed circuit board, taken along lines B-B' of FIG. 13.
Figure 15:
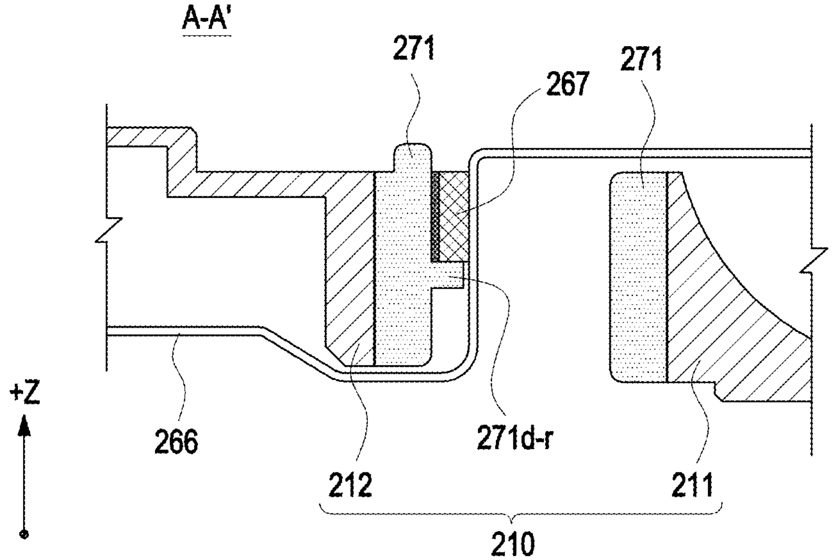
FIG. 15 is a cross-sectional view illustrating the guide member and/or the flexible printed circuit board, taken along line A-A' of FIG. 13.
Figure 16:
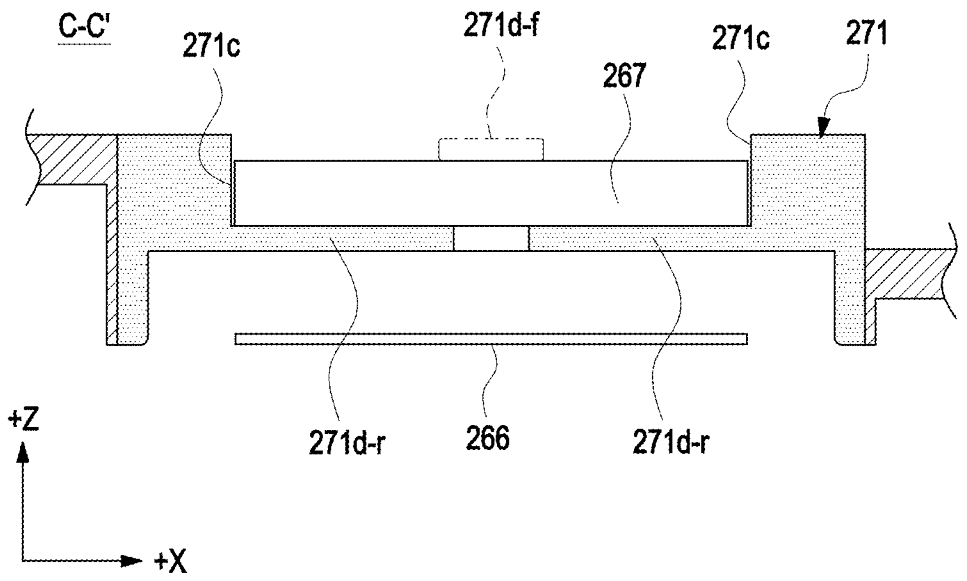
FIG. 16 is a cross-sectional view illustrating the guide member and/or the flexible printed circuit board, taken along line C-C' of FIG. 13.

FIG. 13 is a perspective view illustrating the FPCB disposed on the guide member of FIG. 10. FIG. 14 is a cross-sectional view illustrating the guide member and/or the FPCB, taken along line B-B' of FIG. 13. FIG. 15 is a cross-sectional view illustrating the guide member and/or the FPCB, taken along line A-A' of FIG. 13. FIG. 16 is a cross-sectional view illustrating the guide member and/or the FPCB, taken along line C-C' of FIG. 13.

As illustrated in FIG. 13, the FPCB 266 (e.g., the second portion 266*c* in FIG. 8) is disposed within the first housing 210 (e.g., on the rear surface of the first support area 212) through the wiring hole 271*a*, and the fixing plate 267 may be fixed to the inner wall of the wiring hole 271*a* (e.g., the seating groove 271*b* in FIG. 12). In an embodiment, the fixing plate 267 may be attached within the seating groove 271*b* by a double-sided tape or an adhesive. Referring to FIGS. 14 to 16, the fixing plate 267 may be fixed within the wiring hole 271*b* substantially in the Z-axis direction by being disposed between the stopper ribs 271*d-f* and 271*d-r*, and may be fixed within the wiring hole 271*b* substantially in the Y-axis direction by being disposed between the stopper walls 271*c*. For example, the fixing plate 267 may be disposed to be surrounded by the stopper ribs 271*d-f* and 271*d-r* and/or the stopper walls 271*c* so that the fixing plate 267 is substantially fixed not to move horizontally on a YZ plane. In an embodiment, when the waterproof member 273 is disposed in the wiring hole 271*a*, the fixing plate 267 may closely contact the bottom of the seating groove 271*b* or may be fixed within the wiring hole 271*a*.

Figure 17:
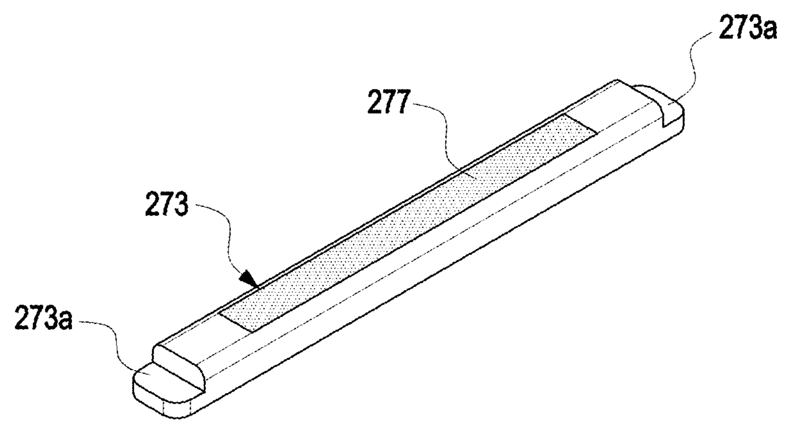
FIG. 17 is a perspective view illustrating a waterproof member in an electronic device according to an embodiment of the disclosure.
Figure 19:
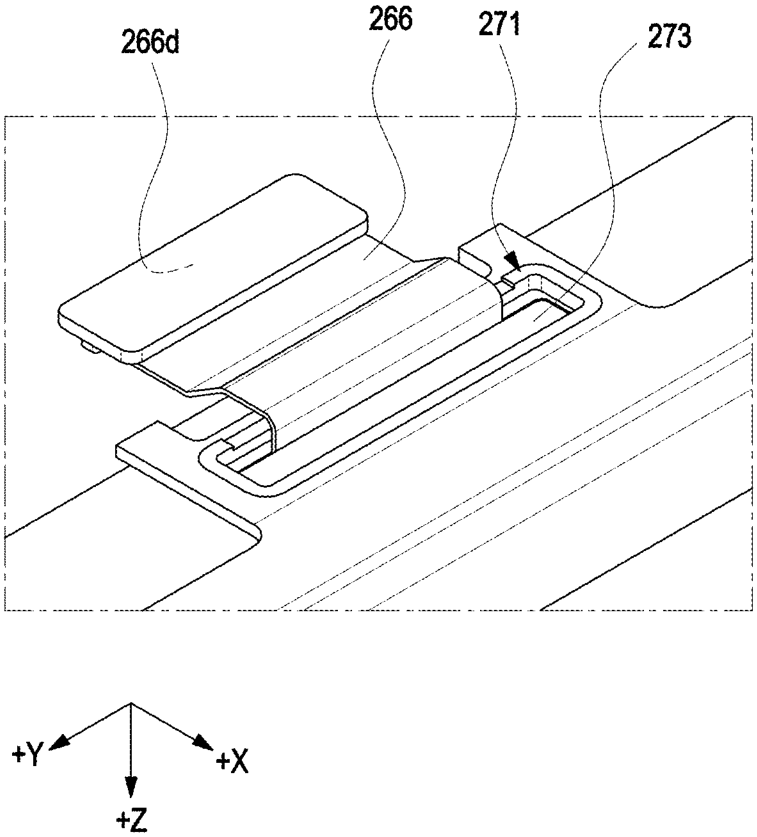
FIG. 19 is a perspective view illustrating a waterproof member viewed from a different direction in an electronic device according to an embodiment of the disclosure.
Figure 20:
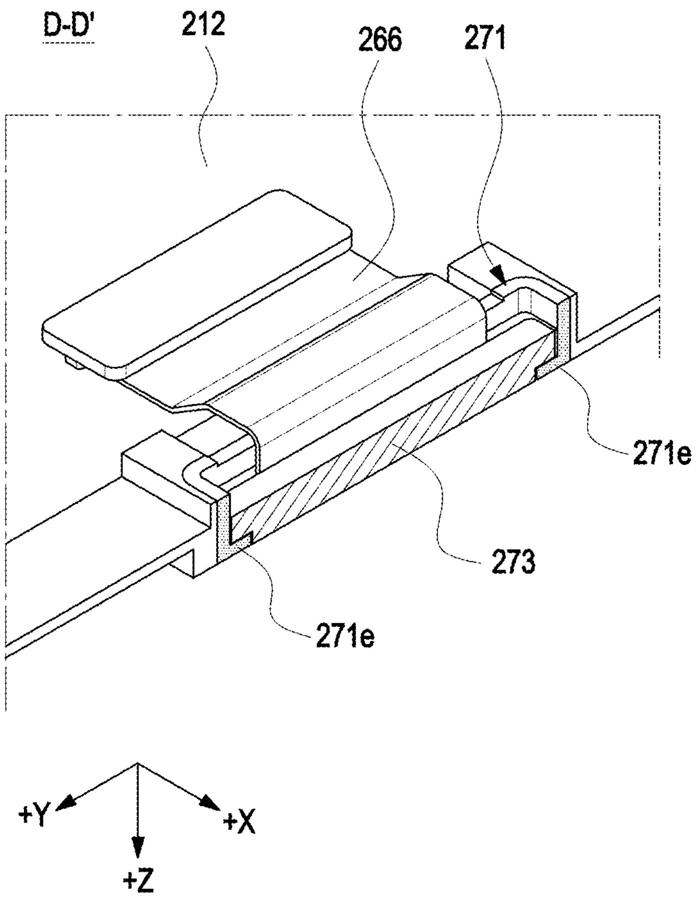
FIG. 20 is a cross-sectional perspective view illustrating the guide member and/or the waterproof member, taken along line D-D' of FIG. 18.
Figure 21:
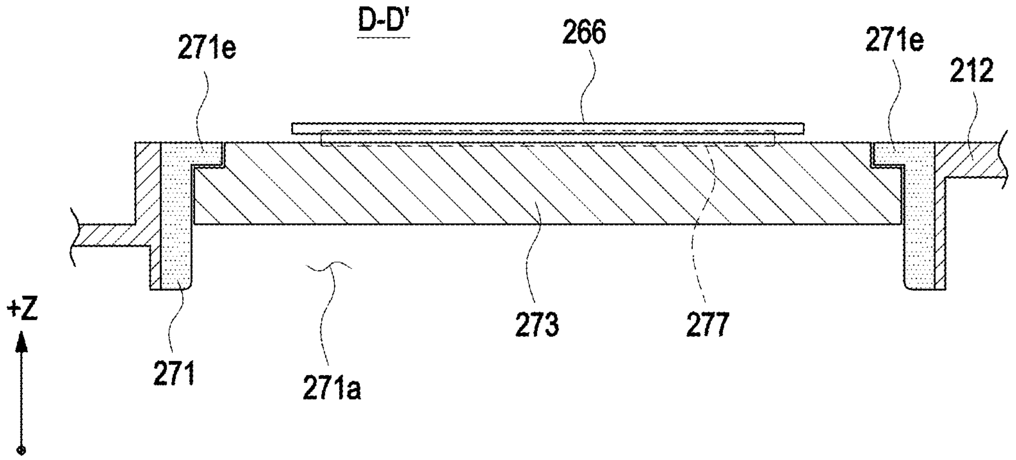
FIG. 21 is a cross-sectional view illustrating the guide member and/or the waterproof member, taken along line D-D' of FIG. 18.

FIG. 17 is a perspective view illustrating a waterproof member in an electronic device according to an embodiment of the disclosure. FIG. 18 is a perspective view illustrating the waterproof member disposed in the electronic device according to an embodiment of the disclosure. FIG. 19 is a perspective view illustrating the waterproof member viewed from another direction in the electronic device according to an embodiment of the disclosure. FIG. 20 is a cross-sectional perspective view illustrating the guide member and/or the waterproof member, taken along line D-D' of FIG. 18. FIG. 21 is a cross-sectional view illustrating the guide member and/or the waterproof member, taken along line D-D' of FIG. 18.

Referring to FIGS. 17 to 21, the electronic device 200 and/or the waterproof member 273 may include the bonding member 277 disposed on one surface thereof, and the bonding member 277 may be disposed on the first housing 210, to substantially face the display 240. In an embodiment, the waterproof member 273 may include avoidance groove (s) 273*a* formed on at least a portion of an edge of the surface thereof. The avoidance groove(s) 273*a* may be formed, for example, at position(s) corresponding to the guide stopper(s) 271*e*. When the waterproof member 273 is accommodated in the wiring hole 271*a*, at least a portion of the guide stopper 271*e* may be located between the display 240 and the waterproof member 273, for example, in the avoidance groove 273*a*. In an embodiment, the waterproof member 273 may be disposed between the FPCB 266 and the hinge module 202, bringing the fixing plate 267 into close contact with the inner wall (e.g., the seating groove 271*b*) of the wiring hole 271*a* or bringing a portion of the FPCB 266 into close contact with the inner wall (e.g., the stopper ribs 271*d-f* and 271*d-r*) of the wiring hole 271*a*. In an embodiment, a surface of the waterproof member 273 may be disposed on the front surface of the first support area 212 to form a planar or curved surface that is continuous with a surface of the guide member 271 and/or a surface of the first support area 212. For example, as the bonding member 277 is substantially exposed on the front surface of the first support area 212, a portion of the FPCB 266 may be bonded to the waterproof member 273 by the bonding member 277.

According to an embodiment, the guide member 271 and/or the wiring hole 271*a* may be formed to be longer than the waterproof member 273 in the Z-axis direction. For example, even when the waterproof member 273 is disposed, a portion of the wiring hole 271*a* may be an empty space on the rear side of the first support area 212. According to an embodiment, the bonding material 275 may be filled or cured in the empty space of the wiring hole 271*a*, which may improve the waterproof performance in the wiring hole 271*a* while firmly fixing the waterproof member 273.

As described above, in a structure of the electronic device 200 where the first housing 210 and the second housing 220 are moved or displaced relative to each other, an embodiment of the disclosure may provide a stable electrical connection structure using the FPCB 266. In an embodiment, design freedom in arranging electrical/electronic components inside the housing(s) 210 and 220 may be increased and a battery capacity may be easily secured, by disposing the wiring hole 271*a* adjacent to an edge of the housing(s) 210 and 220, and/or by disposing the fixing plate 267 of the FPCB 266 within the wiring hole 271*a*. As the waterproof member 273 is disposed in the wiring hole 271*a* to form a waterproof structure, and the FPCB 266 is standardized by disposing the fixing plate 267 or using the bonding member 277, interference between the FPCB 266 and other mechanical structures may be suppressed.

Figure 22A:
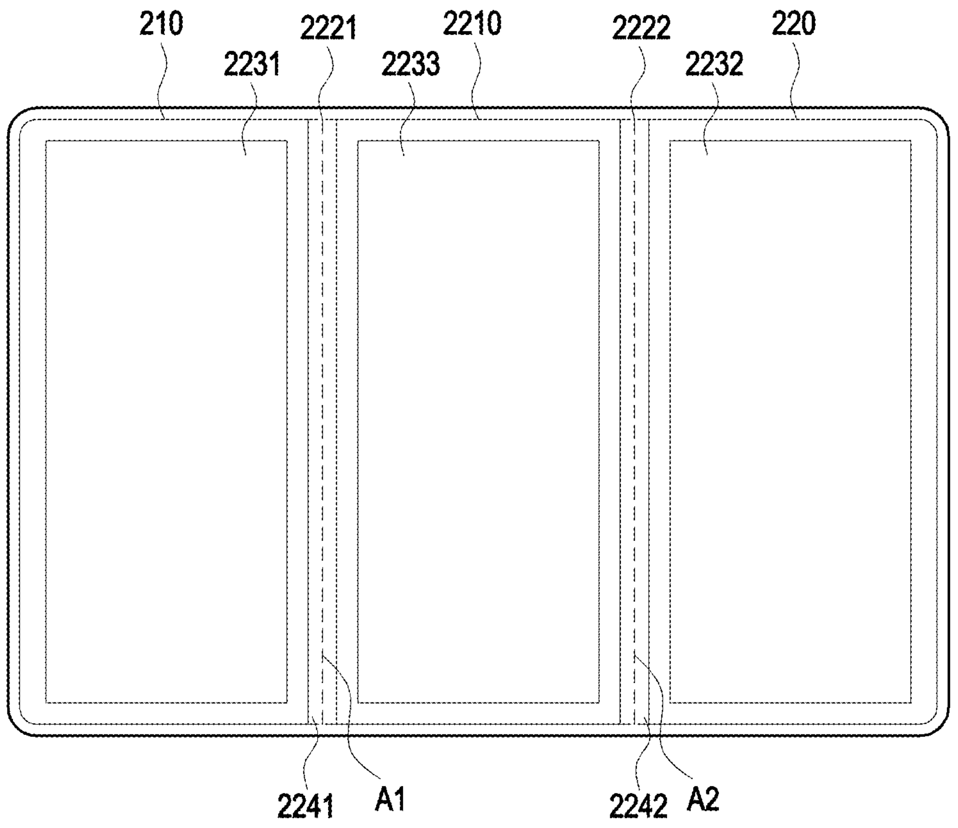
FIGS. 22A and 22B are diagrams illustrating an electronic device in an unfolded state and a folded state, respectively, according to a further embodiment of the disclosure.
Figure 22B:
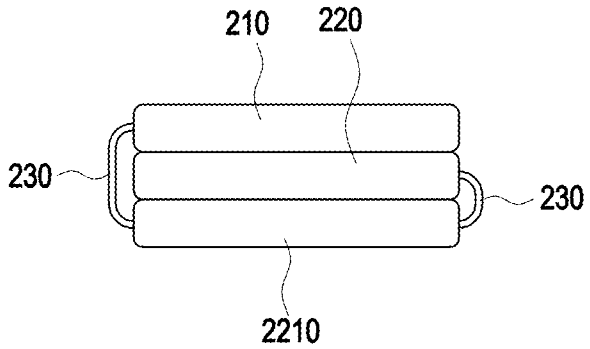

With reference to FIGS. 22A and 22B, according to an embodiment of the disclosure, an electronic device 2200 is provided and may include a first housing (e.g., the first housing 210 in FIGS. 1 to 5), a second housing (e.g., the second housing 220 in FIGS. 1 to 3), a third housing 2210 disposed between the first and second housings and first and second hinges 2221 and 2222 by which the first and second housings are pivotably connected to the third housing 2210 about axes A1 and A2. In these or other cases, at least one of the first and second hinges 2221 and 2222 may have an extended width to accommodate a thickness of the corresponding one of the first and second housings. The electronic device 2200 may further include first, second and third display areas 2231, 2232 and 2233 disposed on the first and second housings and on the third housing 2210, respectively, hinge module 2241 between the first housing and the third housing 2210 and hinge module 2242 between the second housing and the third housing 2210, at least one FPCB (e.g., the FPCB 266 in FIG. 3, 4, or 8) including at least one fixing plate (e.g., the fixing plate 267 in FIG. 4 or 8) disposed on one surface thereof and extending from the third housing 2210 to the first housing across the hinge module 2241 and at least one FPCB (e.g., the FPCB 266 in FIG. 3, 4, or 8) including at least one fixing plate (e.g., the fixing plate 267 in FIG. 4 or 8) disposed on one surface thereof and extending from the third housing 2210 to the second housing across the hinge module 2242.

In an embodiment, the first housing and the second housing may include a support plate (e.g., the first support area 212 in FIG. 3 or 5) supporting at least a portion of the first display area and the second display area, respectively, and forming at least one through hole (e.g., the through hole 213 in FIG. 5) penetrating both surfaces thereof, and a guide member (see, e.g., the guide member 271 described above) disposed in the through hole and forming a wiring hole (e.g., the wiring hole 271*a* in FIG. 4 or 10). In an embodiment, at least a portion of the FPCB may be disposed to pass through the wiring hole, and the fixing plate may be disposed on an inner wall of the wiring hole.

As described above, according to an embodiment of the disclosure, an electronic device (e.g., the electronic device 200 in FIGS. 1 to 3) may include a housing (e.g., the housing 201 in FIG. 3) including a first housing (e.g., the first housing 210 in FIGS. 1 to 5) and a second housing (e.g., the second housing 220 in FIGS. 1 to 3) configured to pivot with respect to the first housing around a folding axis (e.g., the folding axis A in FIG. 1), a display (e.g., the display 240 in FIG. 1, 3, or 4) including a first display area (e.g., the first display area 241 in FIG. 1 or 3) disposed on the first housing, a second display area (e.g., the second display area 242 in FIG. 1 or 3) disposed on the second housing, and a folding area (e.g., the folding area 243 in FIG. 1 or 3) disposed between the first display area and the second display area, a hinge module (e.g., the hinge module 202 in FIG. 3) disposed inside the housing, providing the folding axis, and pivotably connecting the first housing and the second housing to each other, and at least one FPCB (e.g., the FPCB 266 in FIG. 3, 4, or 8) including at least one fixing plate (e.g., the fixing plate 267 in FIG. 4 or 8) disposed on one surface thereof, and extending from the first housing to the second housing across the hinge module. In an embodiment, at least one of the first housing or the second housing may include a support plate (e.g., the first support area 212 in FIG. 3 or 5) supporting at least a portion of one of the first display area and the second display area, and forming at least one through hole (e.g., the through hole 213 in FIG. 5) penetrating both surfaces thereof, and a guide member 271 disposed in the through hole and forming a wiring hole (e.g., the wiring hole 271*a* in FIG. 4 or 10). In an embodiment, at least a portion of the FPCB may be disposed to pass through the wiring hole, and the fixing plate may be disposed on an inner wall of the wiring hole.

According to an embodiment, a first portion (e.g., the first portion 266*b* in FIG. 8) of the FPCB may be disposed between one surface of the support plate and the display, and a second portion (e.g., the second portion 266*c* in FIG. 8) of the FPCB extends from the first portion through the wiring hole and may be disposed on the other surface of the support plate.

According to an embodiment, the fixing plate may be disposed inclined or perpendicular to the first display area or the second display area.

According to an embodiment, the FPCB may further include a connector (e.g., the connector 266*d* in FIG. 8 or 9) disposed on the second portion.

According to an embodiment, the guide member may include a synthetic resin material.

According to an embodiment, the fixing plate may include at least one of a synthetic resin material or a metal material.

According to an embodiment, the electronic device may further include a waterproof member (e.g., the waterproof member 273 in FIG. 4 or 17) disposed at least partially in the wiring hole, between the FPCB and the hinge module.

According to an embodiment, the electronic device may further include a bonding member (e.g., the bonding member 277 in FIG. 4 or 17) disposed between the display and the waterproof member and configured to bond the waterproof member to the FPCB.

According to an embodiment, the waterproof member may include a rubber, silicone, or urethane material.

According to an embodiment, the electronic device may further include a guide plate (e.g., the guide plate 279 in FIG. 4 or 5) disposed between the display and the support plate, and the guide plate may be at least partially disposed between the FPCB and the display.

According to an embodiment, the guide member may include a seating groove (e.g., the seating groove 271*b* in FIG. 10 or 12) formed in an area of the inner wall of the wiring hole, facing a direction in which the hinge module is disposed, stopper walls (e.g., the stopper walls 271*c* in FIG. 12) disposed on portions of edges of the seating groove and provided to face each other in a direction side by side with the folding axis or in a direction parallel to the folding axis, and stopper ribs (e.g., the stopper ribs 271*d-f* and 271*d-r* in FIG. 12) protruding from the inner wall of the wiring hole in other portions of the edges of the seating groove, and aligned along a direction intersecting the folding axis or along a direction perpendicular to the folding axis. In an embodiment, the fixing plate may be disposed in the seating groove, at least partially surrounded by the stopper walls and the stopper ribs.

According to an embodiment, the electronic device may further include a waterproof member disposed at least partially in the wiring hole, between the FPCB and the hinge module, and the waterproof member may be configured to restrain the fixing plate within the seating groove.

According to an embodiment, the guide member may further include a guide stopper (e.g., the guide stopper 271*e* in FIG. 10 or 12) protruding from the inner wall of the wiring hole, and the guide stopper may be at least partially disposed between the waterproof member and the display.

According to an embodiment, the electronic device may further include a bonding material (e.g., the bonding material 275 in FIG. 4 or 5) filled in a portion of the wiring hole, and the waterproof member may be disposed between the bonding material and the display.

According to an embodiment, the waterproof member may be configured to form a waterproof structure within the wiring hole.

As described above, according to an embodiment of the disclosure, an electronic device (e.g., the electronic device 200 in FIGS. 1 to 3) may include a housing (e.g., the housing 201 in FIG. 3) including a first housing (e.g., the first housing 210 in FIGS. 1 to 5) and a second housing (e.g., the second housing 220 in FIGS. 1 to 3) configured to pivot with respect to the first housing around a folding axis (e.g., the folding axis A in FIG. 1), a display (e.g., the display 240 in FIG. 1, 3, or 4) including a first display area (e.g., the first display area 241 in FIG. 1 or 3) disposed on the first housing, a second display area (e.g., the second display area 242 in FIG. 1 or 3) disposed on the second housing, and a folding area (e.g., the folding area 243 in FIG. 1 or 3) disposed between the first display area and the second display area, a hinge module (e.g., the hinge module 202 in FIG. 3) disposed inside the housing, providing the folding axis, and pivotably connecting the first housing and the second housing to each other, and at least one FPCB (e.g., the FPCB 266 in FIG. 3, 4, or 8) extending from the first housing to the second housing across the hinge module. In an embodiment, at least one of the first housing or the second housing may include a support plate (e.g., the first support area 212 in FIG. 3 or 5) supporting at least a portion of one of the first display area and the second display area, and forming at least one through hole (e.g., the through hole 213 in FIG. 5) penetrating both surfaces thereof, a guide member 271 disposed in the through hole and forming a wiring hole (e.g., the wiring hole 271*a* in FIG. 4 or 10), and a waterproof member (e.g., the waterproof member 273 in FIG. 4 or 17) disposed at least partially in the wiring hole and forming a waterproof structure within the wiring hole. In an embodiment, a portion of the FPCB may be bonded to the waterproof member between the display and the waterproof member, and another portion of the FPCB may be fixed between an inner wall of the wiring hole and the waterproof member.

According to an embodiment, the guide member may include a synthetic resin material.

According to an embodiment, the electronic device may include stopper walls (e.g., the stopper walls 271*c* in FIG. 12) formed in an area of the inner wall of the wiring hole, facing a direction in which the hinge module is disposed, and provided to face each other in a direction side by side with the folding axis or in a direction parallel to the folding axis, and stopper ribs (e.g., the stopper ribs 271*d-f* and 271*d-r* in FIG. 12) formed in an area of the inner wall of the wiring hole, facing the direction in which the hinge module is disposed, and aligned along a direction intersecting the folding axis or along a direction perpendicular to the folding axis. In an embodiment, at least one of the stopper ribs may extend from a stopper wall in the direction side by side with the folding axis or in the direction parallel to the folding axis.

According to an embodiment, the electronic device may further include a fixing plate (e.g., the fixing plate 267 in FIG. 4 or 8) provided on a surface thereof, and the fixing plate may be disposed at least partially surrounded by the stopper walls and the stopper ribs.

According to an embodiment, the fixing plate may include at least one of a synthetic resin material or a metal material.

While the disclosure has been described with reference to various embodiments, it is to be understood that the various embodiments are for illustrative purposes, not limiting the disclosure. It will be apparent to those skilled in the art that various changes may be made in the form and detailed structure of the disclosure, including the appended claims and their equivalents, without departing from the overall scope of the disclosure.

The invention claimed is:

1. An electronic device comprising:

a housing including a first housing and a second housing rotatably connected or coupled to each other by a hinge module;

a display including a first display area disposed on the first housing, a second display area disposed on the second housing, and a folding area disposed between the first display area and the second display area;

the hinge module disposed inside the housing; and at least one flexible printed circuit board including at least one fixing plate disposed on one surface thereof, and extending from the first housing to the second housing across the hinge module, wherein at least one of the first housing or the second housing includes:

a support plate supporting at least a portion of one of the first display area and the second display area, and forming at least one through hole penetrating respective surfaces thereof; and a guide member disposed in the through hole and forming a wiring hole, the guide member comprising stopper ribs in the wiring hole, and wherein at least a portion of the flexible printed circuit board is disposed to pass through the wiring hole, and the fixing plate is disposed on an inner wall of the wiring hole, characterized by further comprising:

a waterproof member disposed at least partially in the wiring hole between the flexible printed circuit board and the hinge module, wherein only one side of the at least one flexible printed circuit board contacts a portion of a surface of the waterproof member inside of the wiring hole and an opposite side of the at least one flexible printed circuit board contacts the fixing plate and the stopper ribs of the guide member.

2. The electronic device of claim 1, wherein:

a first portion of the flexible printed circuit board is disposed between one surface of the support plate and the display, and a second portion of the flexible printed circuit board extends from the first portion through the wiring hole and is disposed on the other surface of the support plate.

3. The electronic device of claim 2, wherein the fixing plate is disposed inclined or perpendicular to the first display area or the second display area.

4. The electronic device of claim 2, wherein the flexible printed circuit board comprises:

a variable portion disposed to at least partially surround or cross the hinge module;

first portions extending from both ends of the variable portion, both ends of the variable portion partially overlapping with corresponding ends of the first portions;

second portions extending from the first portions; and connectors disposed on each of the second portions to electrically connect to a circuit board within the first housing and the second housing, and wherein the fixing plate comprises a pair of plates, each of which is disposed on one surface of one of the second portions, coupled to face each other with the first portions and the variable portion therebetween.

5. The electronic device of claim 1, wherein the guide member includes a synthetic resin material.

6. The electronic device of claim 1, wherein the fixing plate includes at least one of a synthetic resin material or a metal material.

7. The electronic device of claim 1, further comprising:

a bonding member disposed between the display and the waterproof member and configured to bond the waterproof member to the flexible printed circuit board, wherein a portion of the at least one flexible printed circuit board is bonded to another portion of the surface of the waterproof member outside the first housing, and wherein the waterproof member includes a rubber, silicone, or urethane material.

8. The electronic device of claim 1, further comprising a guide plate disposed between the display and the support plate, wherein the guide plate is at least partially disposed between the flexible printed circuit board and the display.

9. The electronic device of claim 1, wherein the guide member includes:

a seating groove formed in an area of the inner wall of the wiring hole, facing a direction in which the hinge module is disposed;

stopper walls disposed on portions of edges of the seating groove and provided to face each other in a direction side by side with the folding axis or in a direction parallel to the folding axis; and the stopper ribs protruding from the inner wall of the wiring hole in other portions of the edges of the seating groove, and aligned along a direction intersecting the folding axis or along a direction perpendicular to the folding axis, and wherein the fixing plate is disposed in the seating groove, at least partially surrounded by the stopper walls and the stopper ribs.

10. The electronic device of claim 9, further comprising a waterproof member disposed at least partially in the wiring hole, between the flexible printed circuit board and the hinge module, wherein:

the waterproof member is configured to restrain the fixing plate within the seating groove, the guide member further includes a guide stopper protruding from the inner wall of the wiring hole, the guide stopper being at least partially disposed between the waterproof member and the display, and the electronic device further comprises a bonding material filled in a portion of the wiring hole with the waterproof member disposed between the bonding material and the display and with the waterproof member configured to form a waterproof structure within the wiring hole.

11. An electronic device comprising:

first and second housings;

a display comprising first and second display areas on the first and second housings, respectively, and a folding area between the first and second display areas;

a hinge pivotably connecting the first and second housings; and a flexible printed circuit board (PCB) comprising a surface and a fixing plate on the surface and extending across the hinge between the first and second housings, at least one of the first and second housings comprising:

a support plate supporting a portion of a corresponding one of the first and second display areas and forming a through-hole penetrating respective surfaces thereof; and a guide member in the through-hole and forming a wiring hole through which a portion of the flexible PCB passes with the fixing plate on an inner wall of the wiring hole, wherein:

the electronic device further comprises a waterproof member disposed at least partially in the wiring hole between the flexible PCB and the hinge module, the waterproof member comprises a first surface and a second surface, which is transversely oriented relative to and adjacent the first surface, and the at least one flexible PCB contacts a portion of the first surface of the waterproof member inside of the wiring hole and a portion of the at least one flexible PCB is bonded to the second surface of the waterproof member outside the first housing.

12. The electronic device of claim 11, wherein:

a first portion of the flexible PCB is disposed between one surface of the support plate and the display, a second portion of the flexible PCB extends from the first portion through the wiring hole and is disposed on the other surface of the support plate, the fixing plate is disposed inclined or perpendicular to the first display area or the second display area, and the flexible PCB further includes a connector disposed on the second portion.

13. The electronic device of claim 11, wherein the guide member includes a synthetic resin material.

14. The electronic device of claim 11, wherein the fixing plate includes at least one of a synthetic resin material or a metal material.

15. The electronic device of claim 11, further comprising:

a bonding member disposed between the display and the waterproof member and configured to bond the waterproof member to the flexible PCB, wherein the waterproof member includes a rubber, silicone, or urethane material.

16. The electronic device of claim 11, further comprising a guide plate disposed between the display and the support plate, wherein the guide plate is at least partially disposed between the flexible PCB and the display.

17. The electronic device of claim 11, wherein the guide member includes:

a seating groove formed in an area of the inner wall of the wiring hole, facing a direction in which the hinge module is disposed;

stopper walls disposed on portions of edges of the seating groove and provided to face each other in a direction side by side with the folding axis or in a direction parallel to the folding axis; and stopper ribs protruding from the inner wall of the wiring hole in other portions of the edges of the seating groove, and aligned along a direction intersecting the folding axis or along a direction perpendicular to the folding axis, and wherein the fixing plate is disposed in the seating groove, at least partially surrounded by the stopper walls and the stopper ribs.

18. The electronic device of claim 11, further comprising a waterproof member disposed at least partially in the wiring hole between the flexible PCB and the hinge module, wherein:

the waterproof member is configured to restrain the fixing plate within the seating groove, the guide member further includes a guide stopper protruding from the inner wall of the wiring hole, the guide stopper being at least partially disposed between the waterproof member and the display, and the electronic device further comprises a bonding material filled in a portion of the wiring hole with the waterproof member disposed between the bonding material and the display and with the waterproof member configured to form a waterproof structure within the wiring hole.

19. A foldable electronic device comprising:

a pivotable housing with display and foldable areas; and a flexible printed circuit board (PCB) comprising a surface and a fixing plate on the surface and extending to the housing, the housing comprising:

a support plate supporting a portion of the display area and forming a through-hole penetrating a surface thereof;

a guide member in the through-hole and forming a wiring hole through which a portion of the flexible PCB passes with the fixing plate disposed on an inner wall of the wiring hole;

a waterproof member in the wiring hole between the flexible PCB and the hinge module; and a bonding member disposed between the display and the waterproof member and configured to bond the waterproof member to the flexible PCB, wherein:

the waterproof member comprises a first surface and a second surface, which is transversely oriented relative to and adjacent the first surface, and the at least one flexible PCB contacts a portion of the first surface of the waterproof member inside of the wiring hole and a portion of the at least one flexible PCB is bonded to the second surface of the waterproof member outside the housing.

20. The foldable electronic device of claim 19, further comprising a guide plate disposed between the display and the support plate, wherein the guide plate is at least partially disposed between the flexible PCB and the display.

* * * * *